(12) United States Patent
Miki

(10) Patent No.: US 10,191,839 B2
(45) Date of Patent: Jan. 29, 2019

(54) SEARCH DEVICE INCLUDES ASSOCIATIVE MEMORY, SEARCH DATA GENERATING UNIT FOR GENERATING SEARCH INFORMATION BASED ON HIT INFORMATION AND A SEARCH KEY GENERATING UNIT GENERATING SEARCH KEYS BASED ON SEARCH INFORMATION AND THE SEARCH DATA

(71) Applicant: Renesas Electronics Corporation, Tokyo (JP)

(72) Inventor: Takeo Miki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 77 days.

(21) Appl. No.: 15/590,081

(22) Filed: May 9, 2017

(65) Prior Publication Data

US 2018/0018257 A1 Jan. 18, 2018

(30) Foreign Application Priority Data

Jul. 14, 2016 (JP) ................................. 2016-139220

(51) Int. Cl.
| G11C 15/00 | (2006.01) |
| G06F 12/02 | (2006.01) |
| G06F 17/30 | (2006.01) |
| H03K 19/01 | (2006.01) |
| H03K 19/21 | (2006.01) |
| H04L 12/28 | (2006.01) |

(52) U.S. Cl.
CPC .......... *G06F 12/0215* (2013.01); *G06F 17/30* (2013.01); *G06F 17/30982* (2013.01); *H03K 19/01* (2013.01); *H03K 19/21* (2013.01); *H04L 12/28* (2013.01)

(58) Field of Classification Search
CPC . G06F 12/0215; G06F 17/30; G06F 17/30982
USPC ............... 365/49, 210, 230.03; 711/108, 101
See application file for complete search history.

(56) References Cited

U.S. PATENT DOCUMENTS

| 6,874,016 | B1 | 3/2005 | Gai et al. |
| 7,024,515 | B1 | 4/2006 | Ruan et al. |
| 2008/0082526 | A1* | 4/2008 | Kanawa ............ G06F 17/30893 |
| 2015/0095664 | A1* | 4/2015 | Furukawa ............... G06F 21/62 |
| | | | 713/193 |
| 2016/0011994 | A1* | 1/2016 | Bouley ............... G06F 13/1663 |
| | | | 710/308 |

* cited by examiner

*Primary Examiner* — Connie Yoha
(74) *Attorney, Agent, or Firm* — McGinn IP Law Group, PLLC.

(57) ABSTRACT

To provide a search device with less memory consumption, the search device includes a first associative memory searched with a first search key, a second associative memory searched with a second search key, a concatenated search data generating unit that generates first search information based on hit information including multiple hits in the first associative memory, and a search key generating unit that includes a first key generating unit generating a portion of search data as the first search key and a second search key generating unit generating the first search information and another portion of the search data as the second search key.

20 Claims, 45 Drawing Sheets

FIG. 1

ACL Table

| No. | Src. Port | Dst. Port | Src. Add | Dst. Add | Proto | Action |
|---|---|---|---|---|---|---|
| 1 | any | any | 20.0.0.0/8 | 192.168.10.9/32 | TCP | deny |
| 2 | any | 17-33 | any | 192.168.10.0/24 | TCP | permit |
| 3 | any | any | 30.200.15.0/24 | any | TCP | deny |
| 4 | any | 6-30 | 40.12.0.0/16 | 192.168.11.0/24 | TCP | permit |
| 5 | any | any | any | any | any | deny |

FIG. 2

| No. | RANGE EXPRESSION | RANGE EXPRESSION USING Don't Care EXPRESSION (*) |
|---|---|---|
| 1 | [17] | 16'b0000_0000_0001_0001 |
| 2 | [18-19] | 16'b0000_0000_0001_001* |
| 3 | [20-23] | 16'b0000_0000_0001_01** |
| 4 | [24-31] | 16'b0000_0000_0001_1*** |
| 5 | [32-33] | 16'b0000_0000_0010_00** |

FIG. 3

| No. | RANGE EXPRESSION | RANGE EXPRESSION USING Don't Care EXPRESSION (*) |
|---|---|---|
| 1 | [6-7] | 16'b0000_0000_0000_011* |
| 2 | [8-15] | 16'b0000_0000_0000_1*** |
| 3 | [16-23] | 16'b0000_0000_0001_0*** |
| 4 | [24-27] | 16'b0000_0000_0001_10** |
| 5 | [28-29] | 16'b0000_0000_0001_110* |
| 6 | [30] | 16'b0000_0000_0001_1110 |

FIG. 4

ACL Table

| No. | Src. Port | Dst. Port | Src. Add | Dst. Add | Proto | Action |
|---|---|---|---|---|---|---|
| 1 | any | any | 20.0.0.0/8 | 192.168.10.9/32 | TCP | deny |
| 2 | any | 17-33 | any | 192.168.10.0/24 | TCP | permit |
| 3 | any | any | 30.200.15.0/24 | any | TCP | deny |
| 4 | any | 6-30 | 40.12.0.0/16 | 192.168.11.0/24 | TCP | permit |
| 5 | any | any | any | any | any | deny |

Action Memory

| No. | Action |
|---|---|
| 1 | deny |
| 2 | permit |
| 3 | deny |
| 4 | permit |
| 5 | deny |

Associative Memory

| Entry | Src. Port | Dst. Port | Src. Add | Dst. Add | Proto |
|---|---|---|---|---|---|
| 0 | any | any | 20.0.0.0/8 | 192.168.10.9/32 | TCP |
| 1 | any | 17 | any | 192.168.10.0/24 | TCP |
| 2 | any | 18-19 | any | 192.168.10.0/24 | TCP |
| 3 | any | 20-23 | any | 192.168.10.0/24 | TCP |
| 4 | any | 24-31 | any | 192.168.10.0/24 | TCP |
| 5 | any | 32-33 | any | 192.168.10.0/24 | TCP |
| 6 | any | any | 30.200.15.0/24 | any | TCP |
| 7 | any | 6-7 | 40.12.0.0/16 | 192.168.11.0/24 | TCP |
| 8 | any | 8-15 | 40.12.0.0/16 | 192.168.11.0/24 | TCP |
| 9 | any | 16-23 | 40.12.0.0/16 | 192.168.11.0/24 | TCP |
| 10 | any | 24-27 | 40.12.0.0/16 | 192.168.11.0/24 | TCP |
| 11 | any | 28-29 | 40.12.0.0/16 | 192.168.11.0/24 | TCP |
| 12 | any | 30 | 40.12.0.0/16 | 192.168.11.0/24 | TCP |
| 13 | any | any | any | any | any | same data

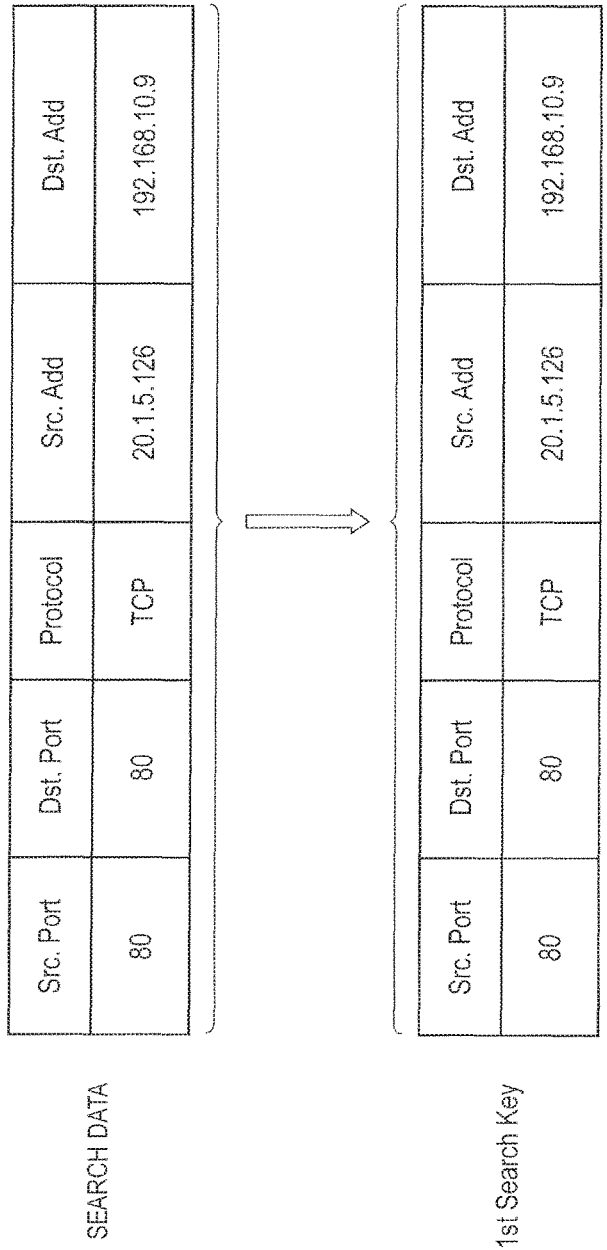

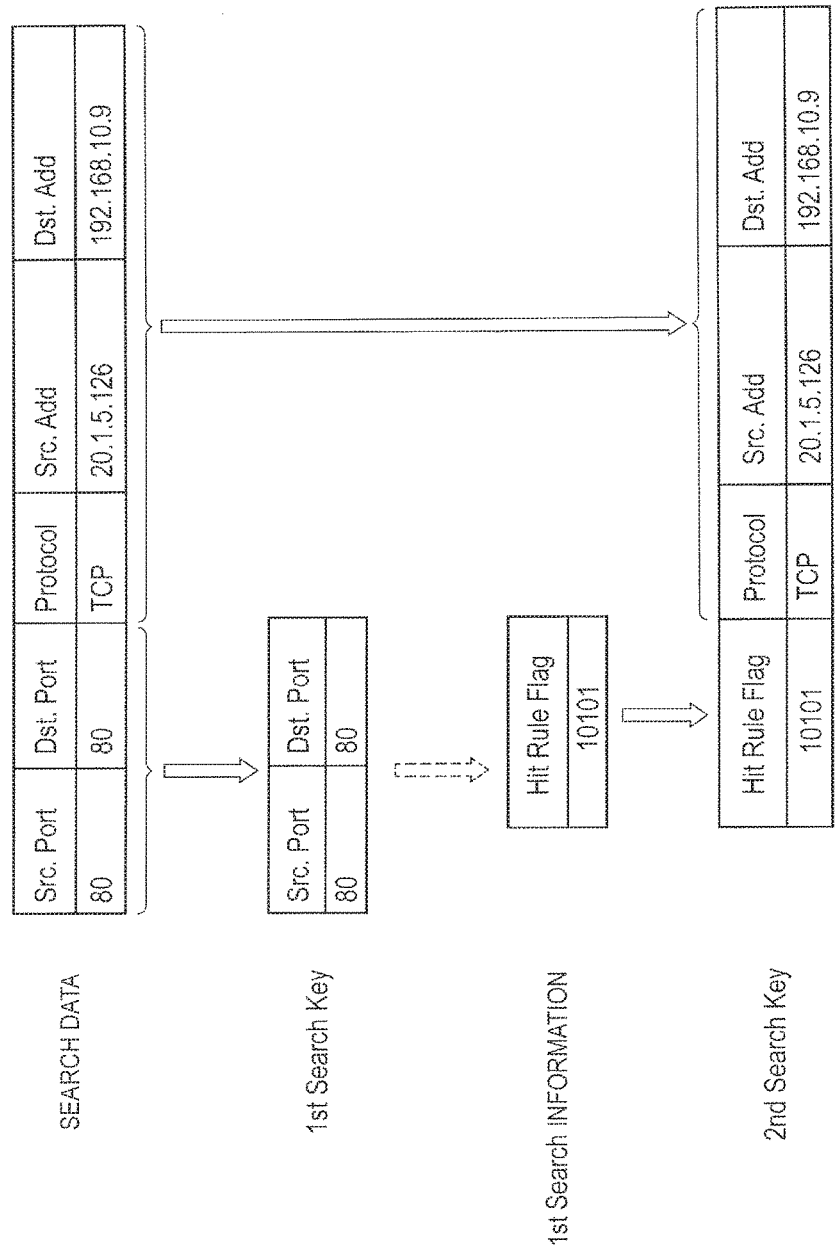

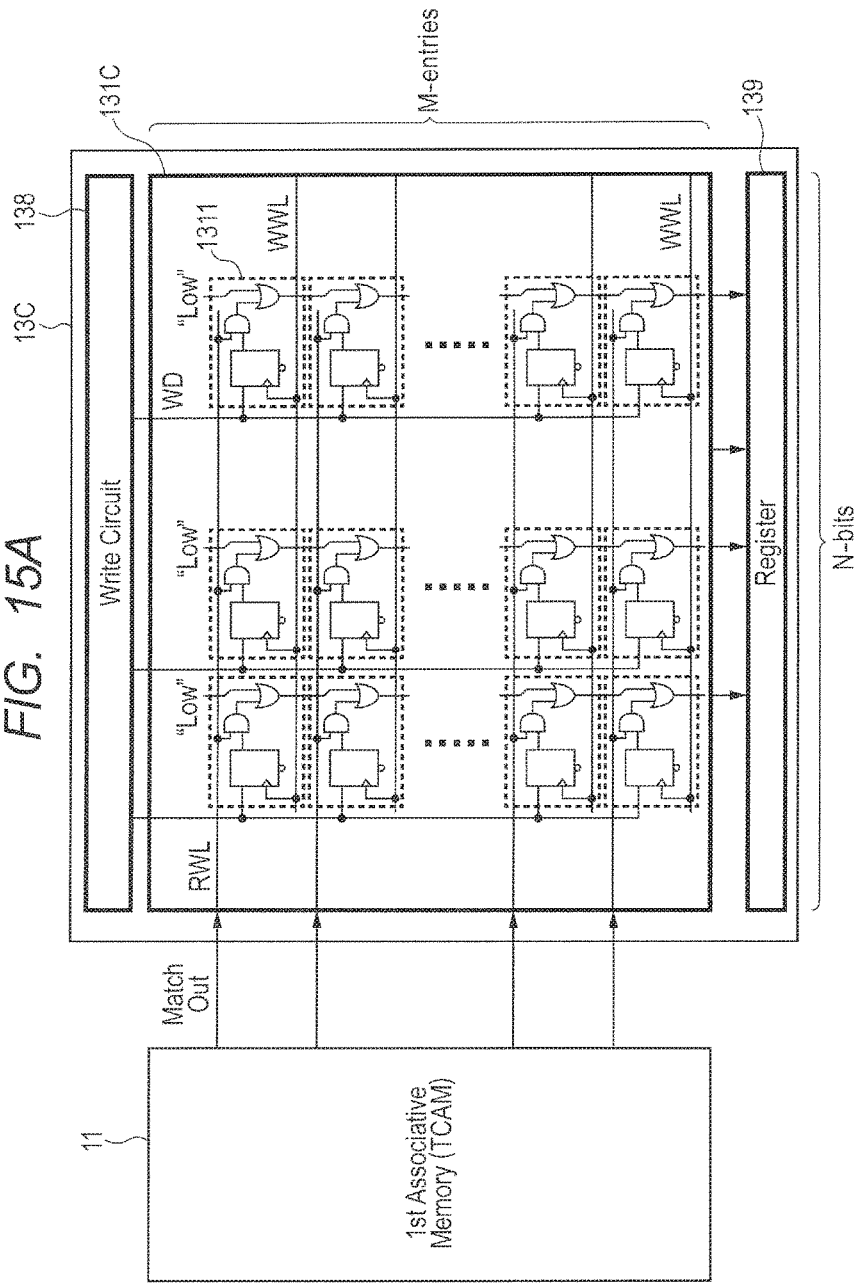

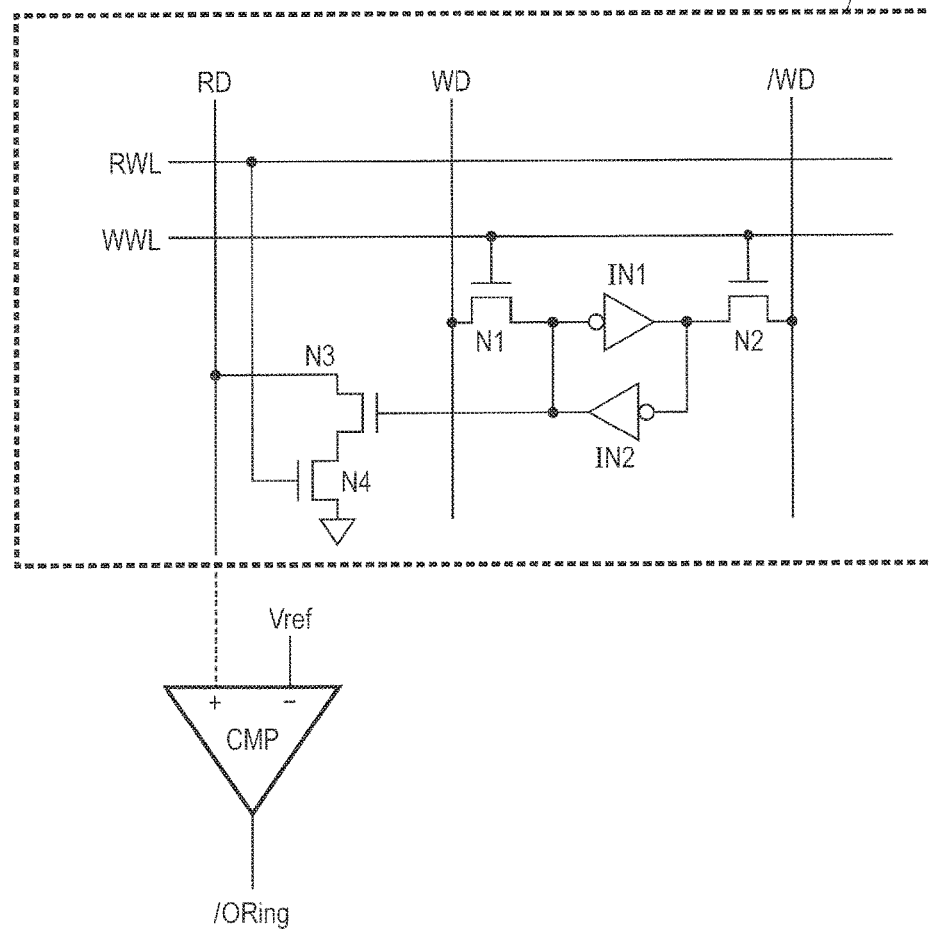

FIG. 28

| No. | RANGE EXPRESSION | RANGE EXPRESSION USING Don't Care EXPRESSION (*) |
|---|---|---|
| 1 | [2-3] | 16'b0000_0000_0000_001* |
| 2 | [4-7] | 16'b0000_0000_0000_01** |
| 3 | [8-9] | 16'b0000_0000_0000_100* |
| 4 | [10-11] | 16'b0000_0000_0000_101* |
| 5 | [12-15] | 16'b0000_0000_0000_11** |
| 6 | [16-17] | 16'b0000_0000_0001_000* |
| 7 | [0-15] | 16'b0000_0000_0000_**** |

ACL Table

| Rule # | Src. Port | Dst. Port | Protocol | Src. Add | Dst. Add |
|--------|-----------|-----------|----------|----------|----------|
| 1 | 2-9 | 10-15 | P1 | S1 | D1 |
| 2 | 4-9 | 12-17 | P2 | S2 | D2 |
| 3 | 4-7 | 0-15 | P3 | S3 | D3 |

FIG. 29B
Associative Memory

| Rule # | Src. Port | Dst. Port | Protocol | Src. Add | Dst. Add |         |
|--------|-----------|-----------|----------|----------|----------|---------|
| 1      | 2-3       | 10-11     | P1       | S1       | D1       |         |
| 1      | 4-7       | 10-11     |          |          |          |         |
| 1      | 8-9       | 10-11     |          |          |          | 6 entries |
| 1      | 2-3       | 12-15     |          |          |          |         |
| 1      | 4-7       | 12-15     |          |          |          |         |
| 1      | 8-9       | 12-15     |          |          |          |         |
| 2      | 4-7       | 12-15     | P2       | S2       | D2       |         |
| 2      | 8-9       | 12-15     |          |          |          | 4 entries |
| 2      | 4-7       | 16-17     |          |          |          |         |
| 2      | 8-9       | 16-17     |          |          |          |         |
| 3      | 4-7       | 0-15      | P3       | S3       | D3       | 1 entry |
|        | 16bits    | 16bits    | 8bits    | 32bits   | 32bits   |         |

104bits

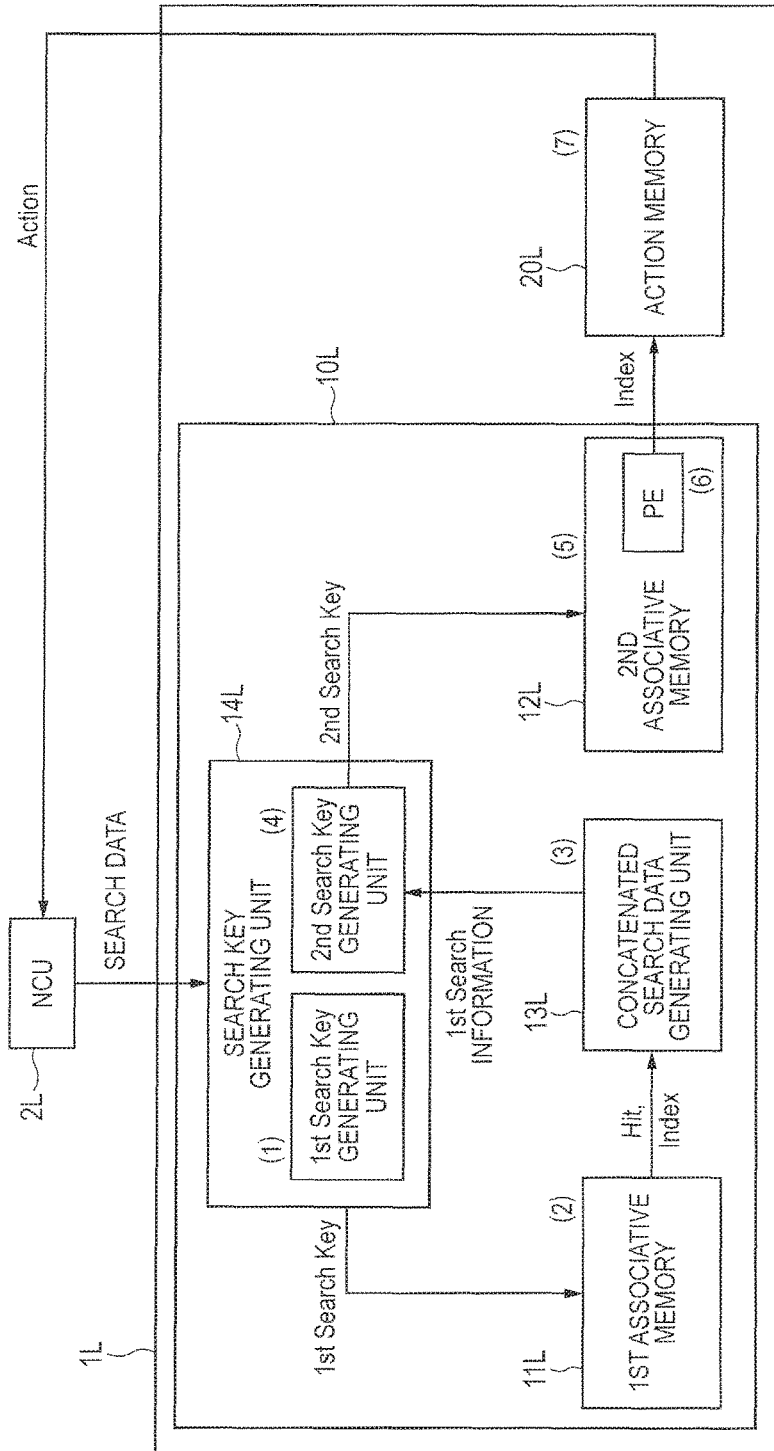

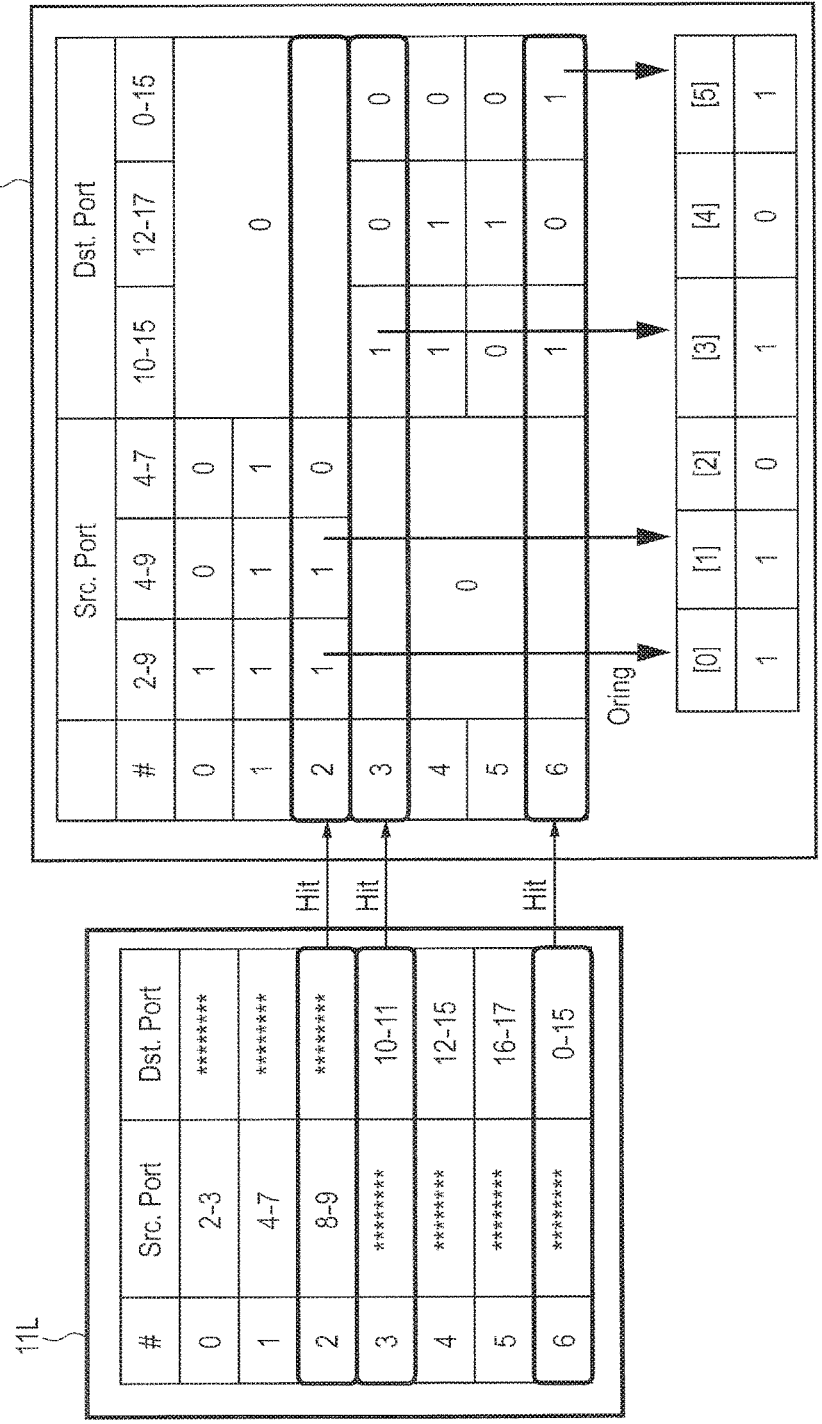

SEARCH DEVICE INCLUDES ASSOCIATIVE MEMORY, SEARCH DATA GENERATING UNIT FOR GENERATING SEARCH INFORMATION BASED ON HIT INFORMATION AND A SEARCH KEY GENERATING UNIT GENERATING SEARCH KEYS BASED ON SEARCH INFORMATION AND THE SEARCH DATA

CROSS-REFERENCE TO RELATED APPLICATIONS

The disclosure of Japanese Patent Application No. 2016-139220 filed on Jul. 14, 2016 including the specification, drawings and abstract is incorporated herein by reference in its entirety.

BACKGROUND

The present disclosure relates to a search device, and can be applied to a search device including an associative memory, for example.

An associative memory is configured by a Content Addressable Memory (hereinafter, simply referred to as a CAM), for example. CAMs each generates, for search (input) data given thereto, an index (address) of the CAM in which the search (input) data is stored. CAMs are used in wide applications including pattern matching, a router of the Internet, a cache of a processor, a TLB (Translation Lookaside Buffer), data compression, an accelerator of a database, a neural network, and memory patch, for example. The CAMs are usually classified into two types, i.e., binary CAMs (hereinafter, referred to as "BCAM") and ternary CAMs (hereinafter, referred to as "TCAMs"). A BCAM stores 0 and 1 in each cell. A TCAM stores 0, 1, and * in each cell. "*" represents "don't care" and matches both 0 and 1.

Techniques related to the present disclosure are U.S. Pat. Nos. 6,874,016 and 7,024,515, for example.

SUMMARY

In a rule table, such as an ACL (Access Control List) defined in a network instrument that is an example of a tuple, for example, long and complicated descriptions are increasing, because settings that are more detailed and more finely fragmented are required as information on coupling between instruments coupled on a network becomes more complicated. Further, the numbers of instruments to be coupled are drastically increasing in recent years, and therefore it is desired to rapidly expand the maximum number of storable rules required in associative memories.

A problem of the present disclosure is to provide a search device with less memory consumption.

Other problems and novel features will be apparent from the description of the present specification and the accompanying drawings.

The summary of typical one of the present disclosures is briefly described below.

A search device according to an embodiment stores a table in a first associative memory and a second associative memory by dividing the table, merges a result of a multi-matching output from the first associative memory by using a function of classifying or logically compressing in accordance with a preset rule, and hands over the merged result to the second associative memory.

According to the above search device, it is possible to efficiently use a memory.

BRIEF DESCRIPTION OF THE DRAWINGS

FIG. 1 is an explanatory diagram of an example of an ACL table.

FIG. 2 is an explanatory diagram of a relation between an expression of a range [17-33] and a don't care expression.

FIG. 3 is an explanatory diagram of a relation between an expression of a range [6-30] and a don't care expression.

FIG. 4 is an explanatory diagram of a method for storing data into an associative memory according to a comparative example.

FIG. 5B illustrates search data and a first search key in FIG. 5A.

FIG. 7B illustrates search data, a first search key, first search information, and second search information in FIG. 7A.

FIG. 15A illustrates a third example of the concatenated search data generating unit in FIG. 11.

FIG. 16 illustrates a first modified example of the memory-grid like register in FIG. 15B.

FIG. 28 is an explanatory diagram of a relation between a range expression and a don't care expression in the ACL table.

FIG. 29A illustrates an example of the ACL table.

FIG. 29B illustrates an example in which the ACL table of FIG. 29A is stored in the associative memory of the comparative example.

FIG. 33A is an explanatory diagram of a data flow during a search operation in a network device according to the modified example.

FIG. 33C illustrates a first associative memory and a concatenated data search data generating unit in FIG. 33A.

DETAILED DESCRIPTION

Figure 5A:
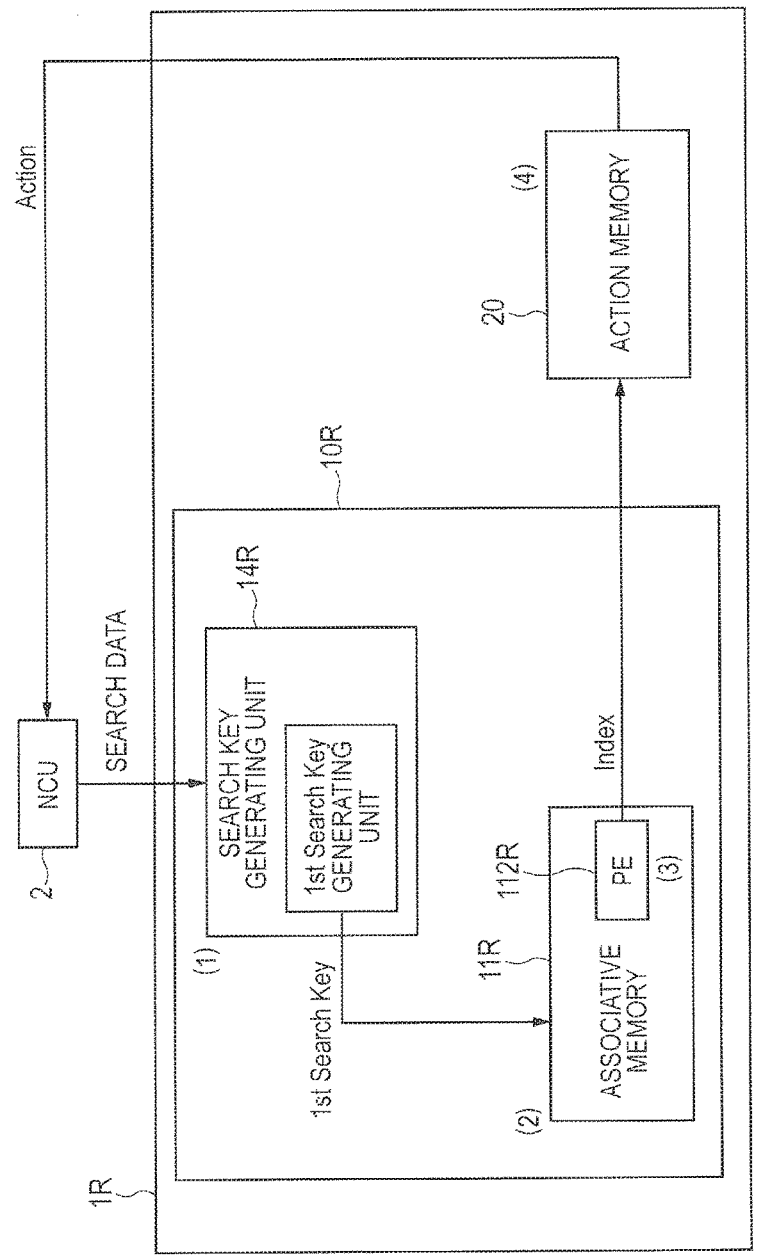
FIG. 5A is an explanatory diagram of a data flow during a search operation in a network device according to the comparative example.

A comparative example, an embodiment, examples, and a modified example are described below, referring to the drawings. In the following description, the same components are labeled with the same reference signs, and redundant description may be omitted.

First, an ACL table is described, referring to FIGS. 1 to 3. FIG. 1 illustrates an example of the ACL table. FIG. 2 illustrates a relation between an expression of a range [17-33] and a don't care expression in FIG. 1. FIG. 3 illustrates a relation between an expression of a range [6-30] and the don't care expression in FIG. 1.

In the ACL table illustrated in FIG. 1, a source port number (Src. Port), a destination port number (Dst. Port), a source IP address (Src. Add), a destination IP address (Dst. Add), a protocol type (Proto or Protocol), and an action (Action) are stored. [17-33] as the destination port numbers (Dst. Port) is a range expression, and can be described as illustrated in FIG. 2 in a case of using a Don't care expression (*). [6-30] as the destination port numbers (Dst. Port) can be also described as illustrated in FIG. 3 in the case of using the Don't care expression. Note that "16'b" means a 16-bit binary expression.

Next, a technique studied by the inventors of the present application (hereinafter, referred to as a comparative example) is described, referring to FIGS. 4 and 5A to 5D.

Figure 5C:
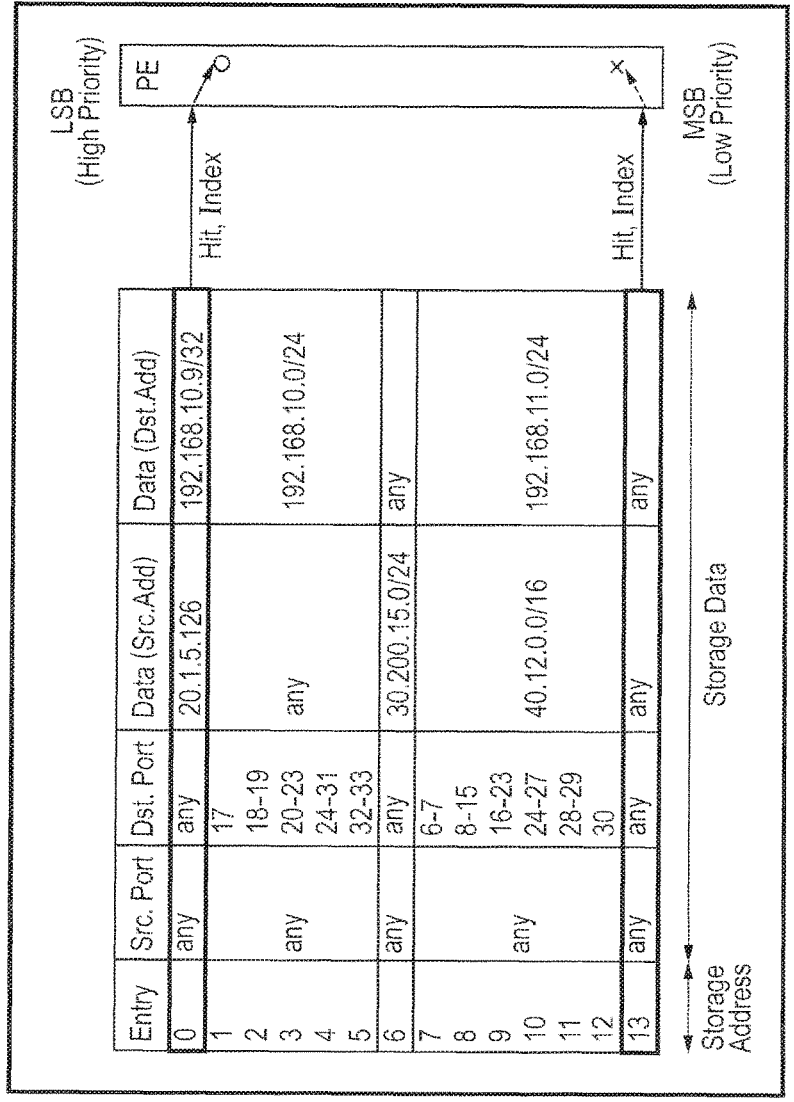
FIG. 5C illustrates an associative memory in FIG. 5A.
Figure 5D:
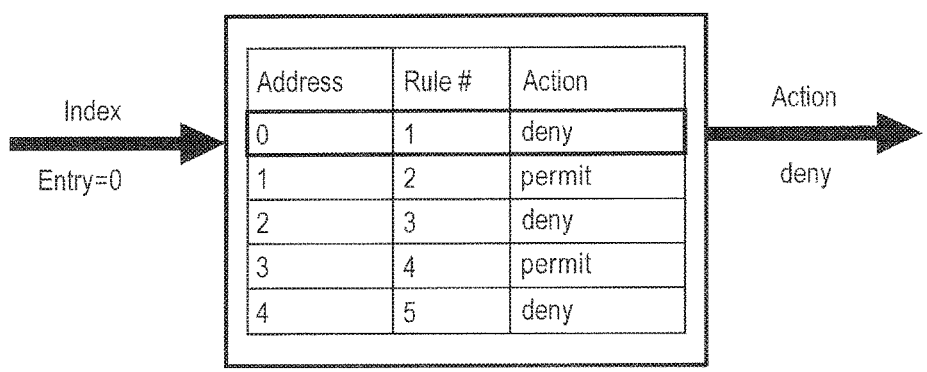
FIG. 5D illustrates an action memory portion in FIG. 5A.

FIG. 4 is an explanatory diagram of a method for storing data into an associative memory according to the comparative example. FIG. 5A is a concept diagram illustrating a data flow during a search operation in a network device according to the comparative example. FIG. 5B illustrates search data and a first search key in FIG. 5A. FIG. 5C illustrates an associative memory in FIG. 5A. FIG. 5D illustrates an action memory unit in FIG. 5A.

In the comparative example, an example using a TCAM as the associative memory is described. In the comparative example, a search operation is performed while the ACL table illustrated in FIG. 1 is stored as one database, as illustrated in FIG. 4. Therefore, 14 entries are consumed in order to store five rules in the ACL table in the TCAM. This is because, 5 entries and 6 entries are required in order to store rule descriptions having ranges [17-33] and [6-30] as illustrated in FIGS. 2 and 3 in the TCAM, respectively. Further, in the specification of IPv4, for example, one entry requires a 104-bit width in total when it is assumed that a source port number (Src. Port) and a destination port number (Dst. Port) each use 16 bits, the source IP address (Src. Add) and the destination IP address (Dst. Add) each use 32 bits, and a protocol type (Proto) uses 8 bits. Therefore, 104 bits×14=1,456 bits are required in total as a memory.

What should be noted here is the source IP address (Src. Add) portion and the destination IP address (Dst. Add) portion. In these portions, it is necessary to put the same data into all entries that use a range expression for one rule. Therefore, in a case where one rule is expressed by using a plurality of lines because of a range expression, redundant memory consumption occurs. An Action in the ACL table is stored in the action memory (Action Memory) unit.

The network device according to the comparative example of FIG. 5A includes a search device 1R and a network control device 2. The search device 1R includes an associative memory unit 10R and an action memory unit 20. The associative memory unit 10R includes an associative memory 11R and a search key generating portion 14R. The network control device (NCU) 2 is configured by an NPU (network processor), an ASIC, or the like.

A main operation flow of the search device 1R is described here.

(1) The network control device 2 sends data that is a search object (search data) as illustrated in FIG. 5B to the search key generating unit 14R in the associative memory unit 10R of the search device 1R. First, the search key generating unit 14R generates a first search key (1st Search Key) as illustrated in FIG. 5B from the sent search data. The search data and the first search key (1st Search Key) are the same as each other.

(2) The associative memory 11R searches data in the associative memory 11R by using the first search key (1st Search Key) generated by the search key generating unit 14R. When a plurality of pieces of data match the first search key (1st Search Key) that is search key data, multi-hit information (a state where a plurality of pieces of data match a key) for all matchings is transmitted to a priority encoder (PE) 112R. As illustrated in FIG. 5C, because "any" is stored in all items of Entry #13 in the associative memory 11R, Entry #13 matches all first search keys, and multiple hits occur. In this example, hits occur for Entries #0 and #13 in the associative memory 11R.

(3) When a plurality of pieces of data match the first search key, only one of matched addresses, which has the highest priority, is sent as a final search result (a hit index (Index)) to the action memory unit 20, because the priority encoder (PE) 112R is coupled. For the priority encoder 112R, the priority is the highest in LSB and is the lowest in MSB. Therefore, Entry #0 is output.

(4) The action memory unit 20 is pre-programmed as to which action (Action) is to be performed for data input to the search device 1R (e.g., an IP address or a port number) based on the search result. The action memory unit 20 performs an operation for reading data corresponding to the address of the final search result and transmits its result to the network control device 2. As illustrated in FIG. 5D, deny in Entry #0 is output as Action. With this, a sequence of search operations is completed.

As illustrated in FIG. 5A, storing one ACL table in one associative memory causes a redundant area to operate, which in turn increases memory consumption and also increases power consumption in proportion to the increase of the memory consumption. In a case where an associative memory is configured by a CAM, such as a TCAM, because of characteristics that a power increases in accordance with a memory use capacity, there are a problem of countermeasures against heat generation caused by the increase of the power and a problem related to design of a power source. These problems make it difficult to simply increase the memory capacity. Therefore, it is necessary how to use a memory itself efficiently. Although a rule described in a range expression is not used to the source port number (Src. Port) portion in the comparative example for simplifying the description, it is necessary to store entries for all combinations in the TCAM when a rule described in a range expression similar to the destination port number (Dst. Port) portion is applied to this portion. Therefore, as the rule description becomes more complicated, the number of entries increases.

Figure 6:
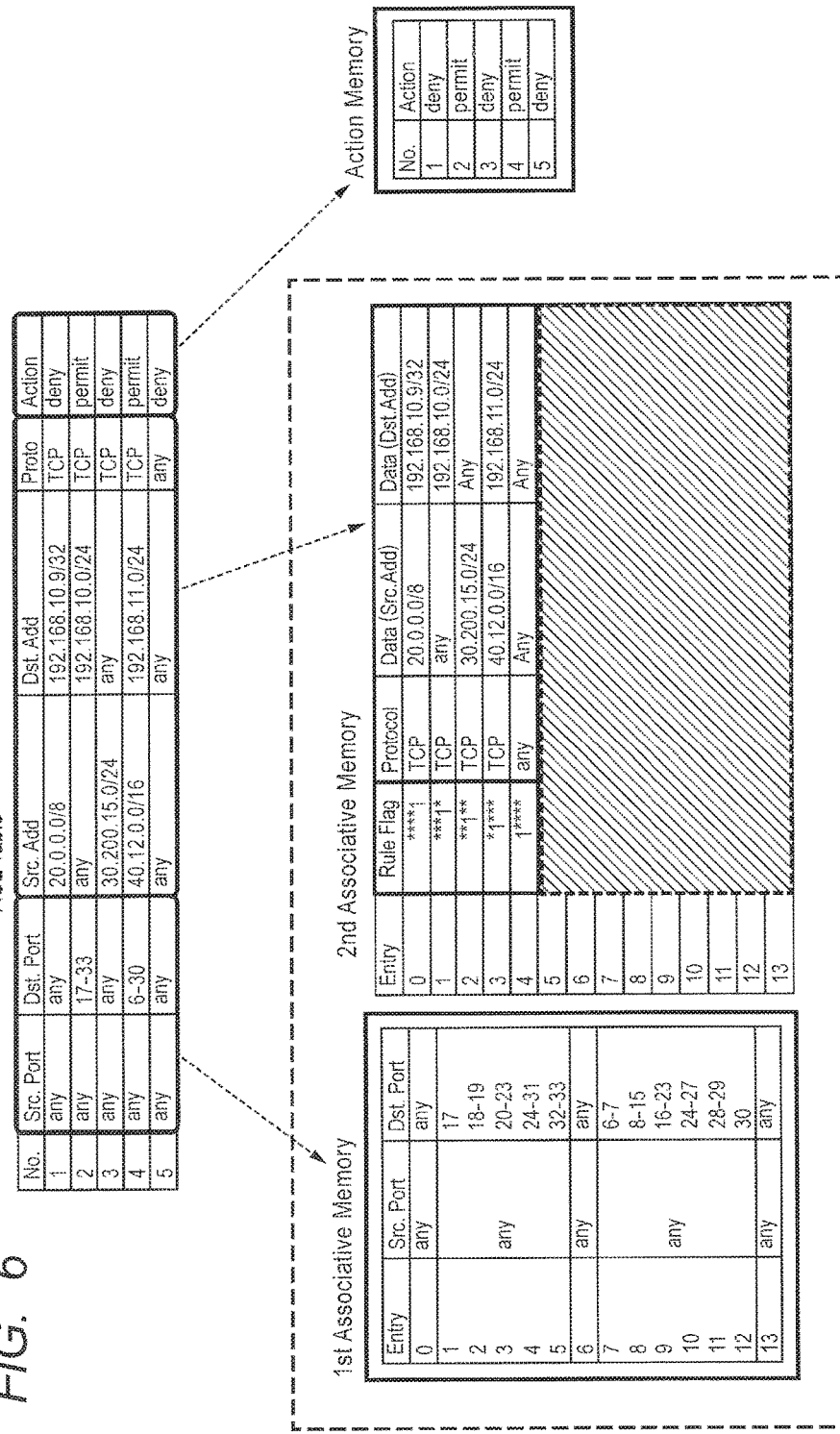
FIG. 6 is an explanatory diagram of a method for storing data into an associative memory according to an embodiment.

Next, a search mechanism according to an embodiment is described, referring to FIG. 6. FIG. 6 illustrates a method for storing data into an associative memory according to the embodiment.

A search device according to the embodiment stores a table into a first associative memory and a second associative memory while dividing the table, merges a result of multi-matching output from the first associative memory and search information (hit information, miss information, a hit address, and the like) with each other by using a function of classifying or logically compressing in accordance with a preset rule, and hands over the merged result to the second associative memory. Although data to be added for concatenation with the first associative memory (e.g., Rule Flag) is stored in the second associative memory, it is unnecessary to put the same data into all entries using a range expression in one rule in the second associative memory, and therefore redundant memory consumption does not occur even in a case where one rule is expressed by using a plurality of lines because of a range expression. Therefore, a hatched portion is no longer necessary, so that consumption of a memory is reduced. Assuming that the number of entries in the first associative memory is M, the number of entries in the second associative memory is L, and the number of rules is N, relations of L<M and N<M. are satisfied. In another case than a search in the ACL table, a memory corresponding to the action memory is not always required.

According to the embodiment, it is unnecessary to store overlapping data, unlike the comparative example. Therefore, the memory can be largely reduced. Due to this advantageous effect, in a case of using a TCAM as the associative memory, not only an effect of low memory consumption is expected, but also a memory resource that is expensive in bit unit price can be efficiently used.

The embodiment achieves a search by concatenating a search table and transmitting multi-matching information. Therefore, it is possible to freely select a table size by adding a set of an associative memory and concatenated search data generating unit in serial coupling as a concatenating mechanism. While conventionally a search of a long character string can be achieved only by a search method that requires a long latency for one search operation, such as a tree search, that search can be achieved by coupling associative memories in series in the embodiment. Therefore, it is possible to perform a search for a table having a large horizontal width (e.g., a table that is large in the number of characters or the number of digits of a numerical character), for which a search is difficult so far.

Further, in the embodiment, it is easy to employ a pipeline configuration without using branch processing. Therefore, the embodiment can easily increase a processing performance and is suitable for processing a large amount of data. For this reason, the embodiment can be applied not only to network instruments but also analysis of big data in a work station.

The embodiment provides the following advantageous effects.

(1) A search of a long character string is possible.
(2) Memory consumption can be reduced, because the same character string portions can be separated from other portions for each table and can be put in one. Also, improvement of the number of storable rules per unit is possible.
(3) Because the memory consumption can be reduced, a power can be also reduced.
(4) The embodiment can deal with a rule file with a large size.
(5) A high-speed table maintenance operation is possible.
(6) Divided operations are possible and an unnecessary search operation can be stopped. Therefore, power consumption can be further reduced.

A form of the associative memory may be a CAM, such as a TCAM or a BCAM, configured by hardware only, or may be a form in which the function of the associative memory is emulated by using a general purpose RAM (e.g., a DRAM, an SRAM, and a Flash memory) and a tree-structure search or a hash table or is emulated by software (a CPU and a memory).

A mechanism for classifying multi-hit information obtained by the search and a function portion for compressing data may be configured by using an FPGA. Further, the mechanism for classifying the multi-hit information may be performed by a programmable logic circuit, such as a CPU, or a grid arrangement of memories and logic circuits. Furthermore, a classification function may be emulated by software.

An example of the aforementioned embodiment is described below. The example provides the advantageous effects of the aforementioned embodiment.

Example

Figure 7A:
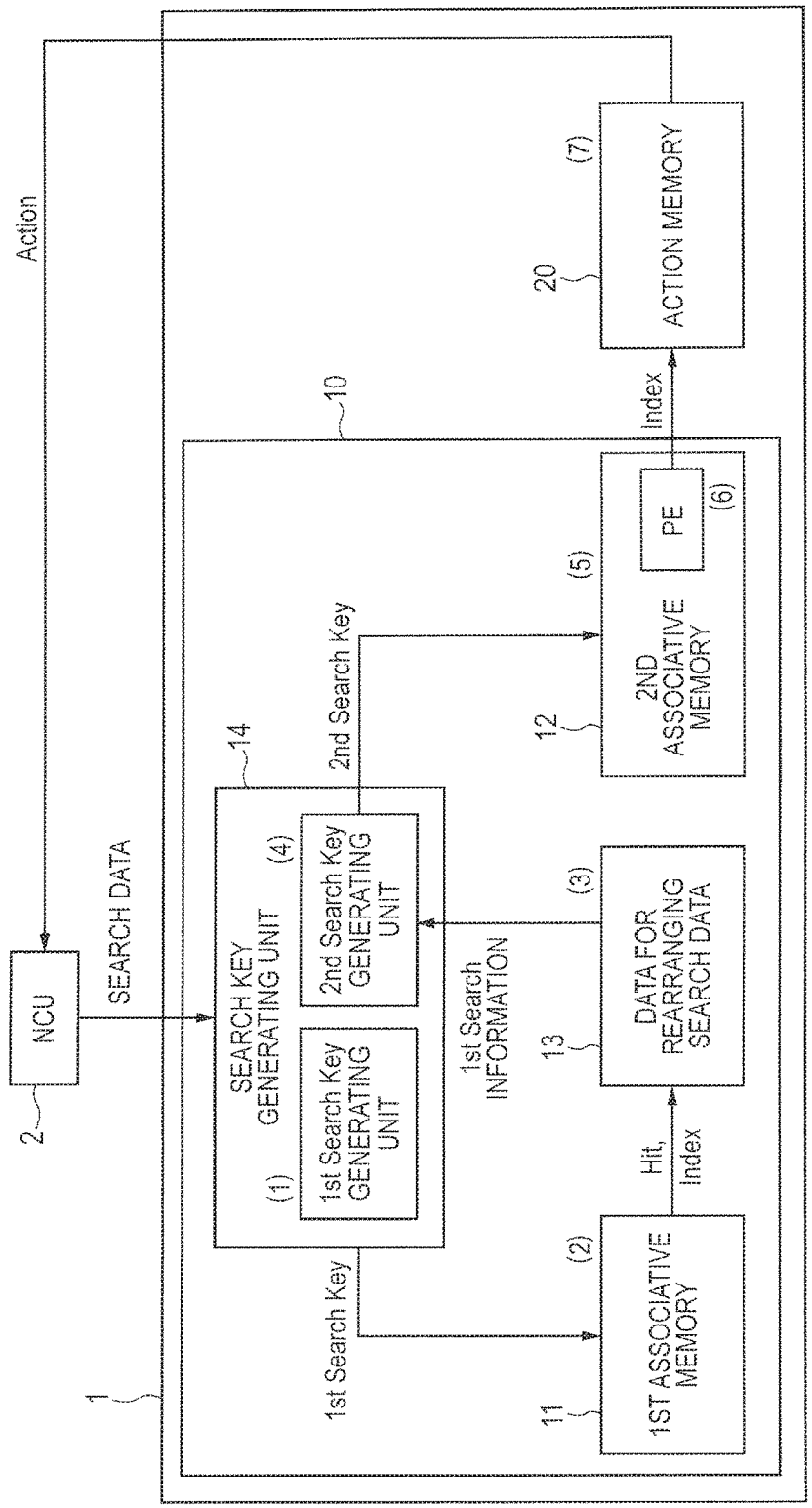
FIG. 7A is an explanatory diagram of a data flow during a search operation in a network device according to the embodiment.
Figure 7C:
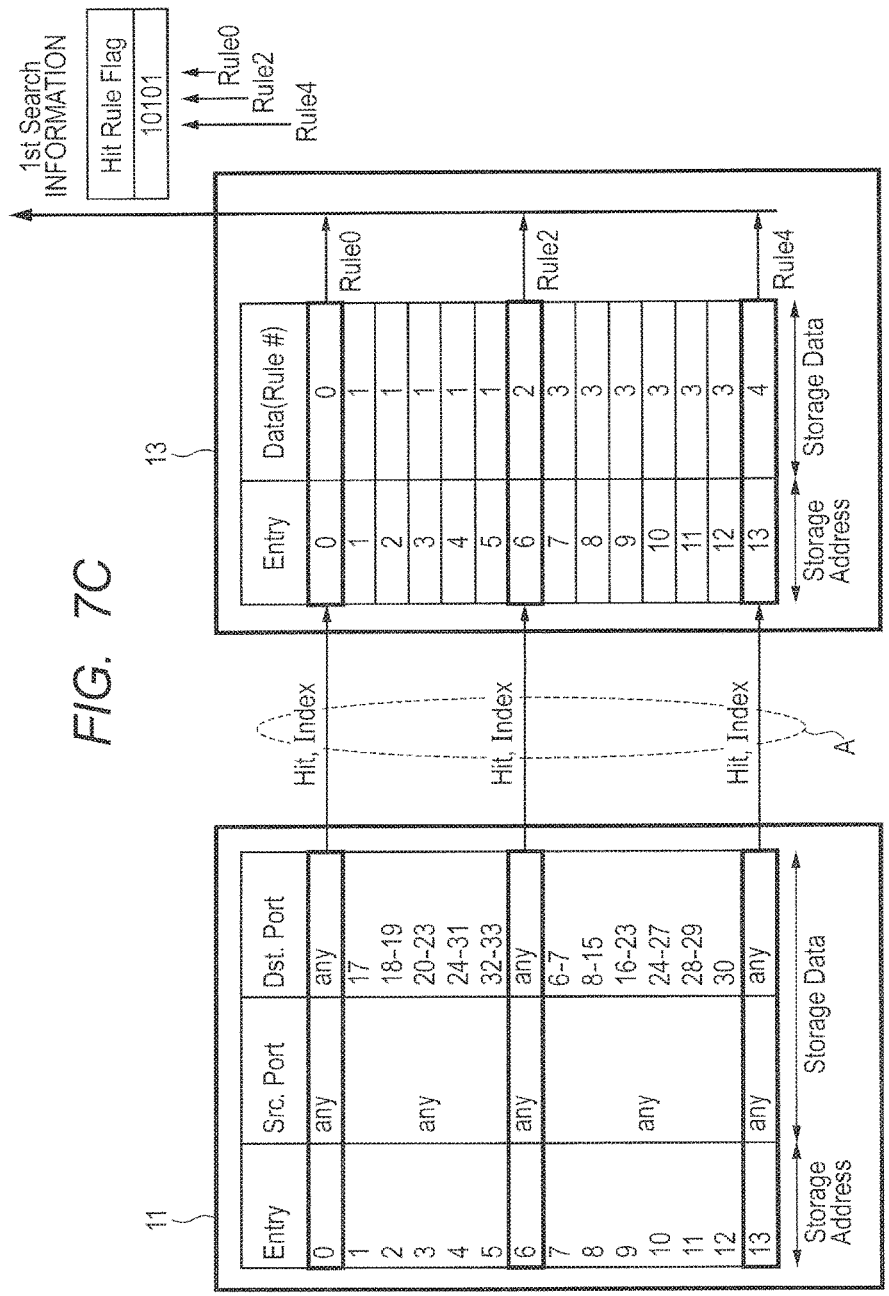
FIG. 7C illustrates a first associative memory and concatenated data search data generating unit in FIG. 7A.
Figure 7D:
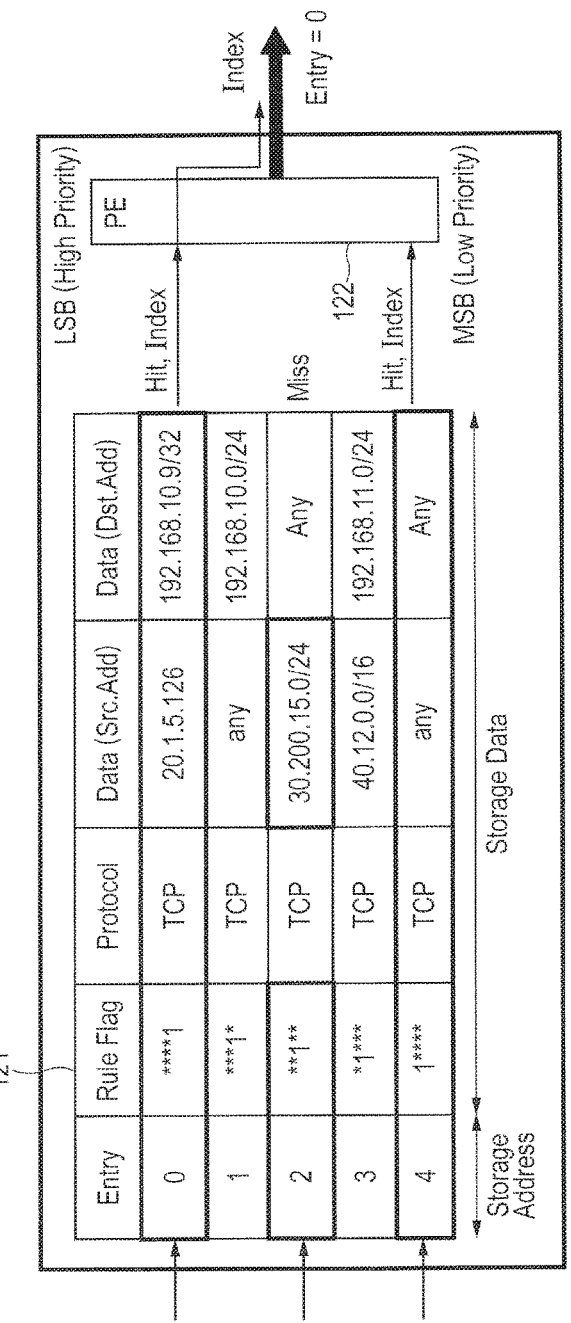
FIG. 7D illustrates a second associative memory in FIG. 7A.
Figure 7E:
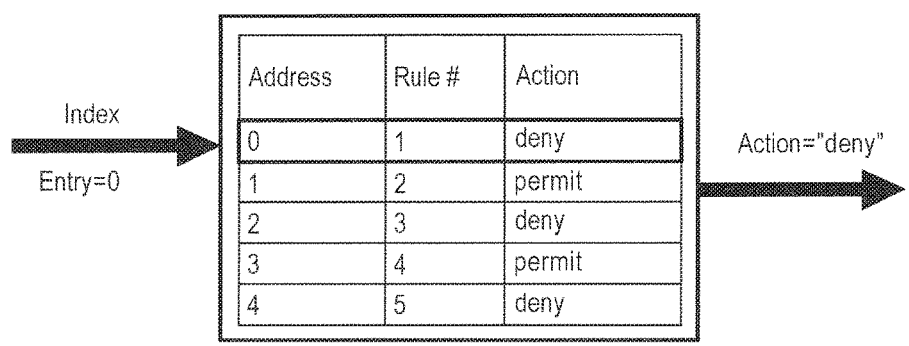
FIG. 7E illustrates an action memory portion in FIG. 7A.

A search mechanism according to an example is described, referring to FIGS. 7A to 7E. FIG. 7A is a concept diagram illustrating a data flow during a search operation in a network device according to the example. FIG. 7B illustrates search data, a first search key, first search information, and a second search key in FIG. 7A. FIG. 7C illustrates a first associative memory and a concatenated search data generating unit in FIG. 7A. FIG. 7D illustrates a second associative memory in FIG. 7A. FIG. 7E illustrates an action memory in FIG. 7A.

The network device according to the example includes a search device 1 and the network control device (NCU) 2. The search device 1 includes an associative memory unit 10 and an action memory unit 20. The associative memory unit 10 includes a first associative memory 11, a second associative memory 12, a concatenated search data generating unit 13, and a search key generating unit 14. The search key generating unit 14 includes a first search key (1st Search Key) generating unit and a second search key (2nd Search Key) generating unit. The network control device 2 is configured by an NPU (a network processor), an ASIC, or the like. In the example, an example of using a TCAM as associative memories is described. An example is described in which the number of entries in the first associative memory (M) is 15, the number of entries in the second associative memory (L) is less than that in the first associative memory and is 5, and the number of rules (N) is 5.

A main operation flow of the search device 1 is described here.

(1) The network control device 2 sends data that is a search object (search data) as illustrated in FIG. 7B to the search key generating unit 14 in the associative memory unit 10 of the search device 1. First, the search key generating unit 14 generates the first search key (1st Search Key) illustrated in FIG. 7B by the first search key (1st Search Key) generating unit from the sent search data. The first search key (1st Search Key) can be easily generated because it is a portion of the search data cut out from the search data.

(2) In a search at the first step, the first associative memory 11 searches data in the first associative memory 11 by using the first search key (1st Search Key) generated by the first search key (1st Search Key) generating unit of the search key generating unit 14. When a plurality of pieces of data match the first search key (1st Search Key) that is search key data, the first associative memory 11 transmits multi-hit information (a state in which a plurality of pieces of data match a key) for all matchings to the concatenated search data generating unit 13. Because "any" is stored in Entries #0, #6, and #13 in the first associative memory 11 as illustrated in FIG. 7C, these entries match all the first search keys, so that multiple hits occur.

(3) Subsequently, the concatenated search data generating unit 13 classifies and logically compresses the result of the search in the first associative memory 11 and then outputs the first search (1st search) information illustrated in FIG. 7B to the search key generating unit 14 in order to generate the second search key (2nd Search Key). As illustrated with an ellipse in broken line A in FIG. 7C, the multi-hit information on entries (Indexes) for which Hit occurs is transmitted to the concatenated search data generating unit 13, so that search information is handed over. The concatenated search data generating unit 13 has data corresponding to entries (rule number (Rule #) stored therein and performs compression into data the number of pieces of which is the number of rules.

(4) The second search key (2nd Search Key) generating unit of the search key generating unit 14 then generates the second search key (2nd Search Key) used in a search at the second step as illustrated in FIG. 7B by using information on the search result in the first associative memory 11 (1st search information) supplied from the concatenated search data generating unit 13 and the search data received at first. The second search key (2nd Search Key) can be easily generated because the second key is obtained by concatenating the search result information (1st search information) and a reminder obtained by removing the first search key (1st Search Key) from the search data.

(5) The second associative memory 12 performs a search whether the second search key (2nd Search Key) is included in data in the second associative memory 12 by using the second search key (2nd Search Key) generated by the second search key (2nd Search Key) generating unit of the search key generating unit 14. As illustrated in FIG. 7D, hits occur in Entries #0 and #4 in the second associative memory 12. Because the search in the second associative memory 12 is performed after the search in the first associative memory 11 is finished, the capacity of an associative memory operating at the same time can be reduced, so that it is possible to achieve less power consumption than in the comparative example.

(6) When a plurality of pieces of data match a search key, only one of matched addresses, which has the highest priority, is sent to the action memory unit 20 as a final search result (a hit index) because a priority encoder (PE) 122 is coupled to a memory unit 121 of the second associative memory 12 in this example. In the priority encoder 122, the priority is the highest at LSB and is the lowest at MSB. Therefore, Entry #0 is output.

(7) The action memory unit 20 is pre-programmed as to which action (Action) is to be performed for data (e.g., an IP address or a port number) input to the search device 1 based on the search result. The action memory unit 20 performs an operation for reading data corresponding to the address of the final search result and transmits that result to the network control device 2. In FIG. 7E, deny in Entry #0 is output as the action (Action). With this output, a series of search operations is completed.

Figure 8:
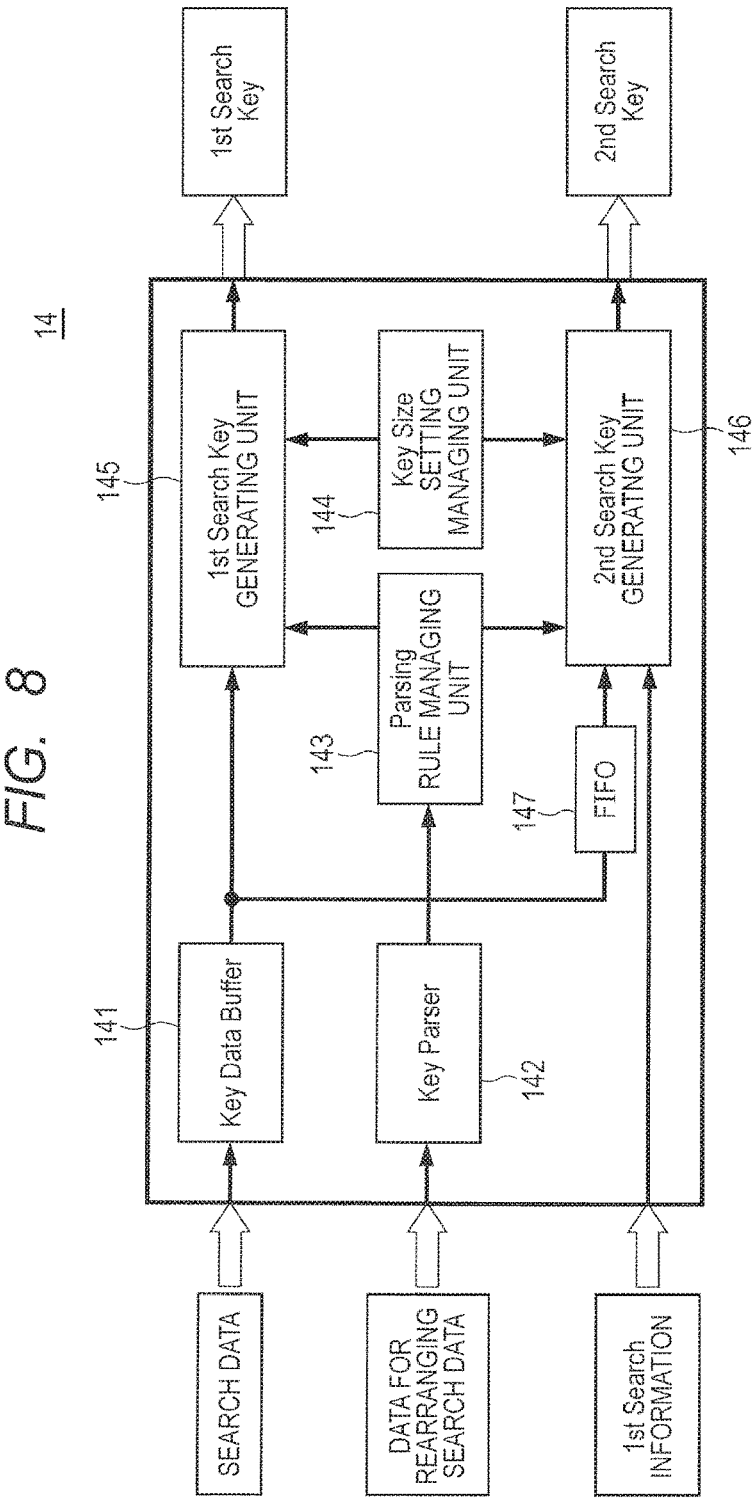
FIG. 8 is a block diagram illustrating a configuration example of a search key generating unit in FIG. 7A.

Next, the search key generating unit in FIG. 7A is described, referring to FIG. 8. FIG. 8 is a block diagram of a configuration example of the search key generating unit in FIG. 7A.

The search key generating unit 14 is configured by a key data buffer 141, a key parser unit 142, a parsing rule managing unit 143, a key size setting managing unit 144, a first search key (1st Search Key) generating unit 145, a second search key (2nd Search Key) generating unit 146, and an FIFO 147.

First, search data that is input is stored in the key data buffer 141. The first search key generating unit 145 then generates the first search key by segmenting the search data for use in the first associative memory 11 based on information programmed in the parsing rule managing unit 143 and information programmed in the key size setting managing unit 144. The second search key generating unit 146 adds match information (1st Search information) obtained by the search at the first step to a reminder obtained by removing the first search key from the search data, to generate the corresponding second search key for use in the second associative memory 12. The 1st Search information contains multi-hit information, the hit rule number, the tag number, a hit index, and the like.

That is, the second search key (2nd Search Key) is changed in real time by match information (1st Search information) for the input search data. With this mechanism that allows a real-time change, the result of the search at the first step and the result of the search at the second step can be concatenated.

The key data buffer 141 is a portion that performs primary storing of search data and adjustment of a latency, and can be configured by an FIFO configuration or a memory, such as 2-port SRAM.

The parsing rule managing unit 143 generates a plurality of search keys by rearranging only a portion of a search key in generation of the search key, thereby generating data for simultaneously performing a plurality of searches.

The key size setting managing unit 144 sets the size of each of the first search key and the second search key therein, and has a function of providing information for assigning a search key size to any of the preset size by the key parser unit 142.

The first search key (1st Search Key) generating unit 145 has a function of generating the first search key based on information preprogrammed in the parsing rue managing unit 143 or the key size setting managing unit 144 to correspond to a search table size of the first associative memory 11.

The second search key generating unit 146 has a function of generating the second search key corresponding to a search table size of the second associative memory 12 based on the search result including the multi-hit information obtained in the search at the first step and original search data temporarily held in the key data buffer 141 until the result of the search at the first step is fixed.

Figure 9:
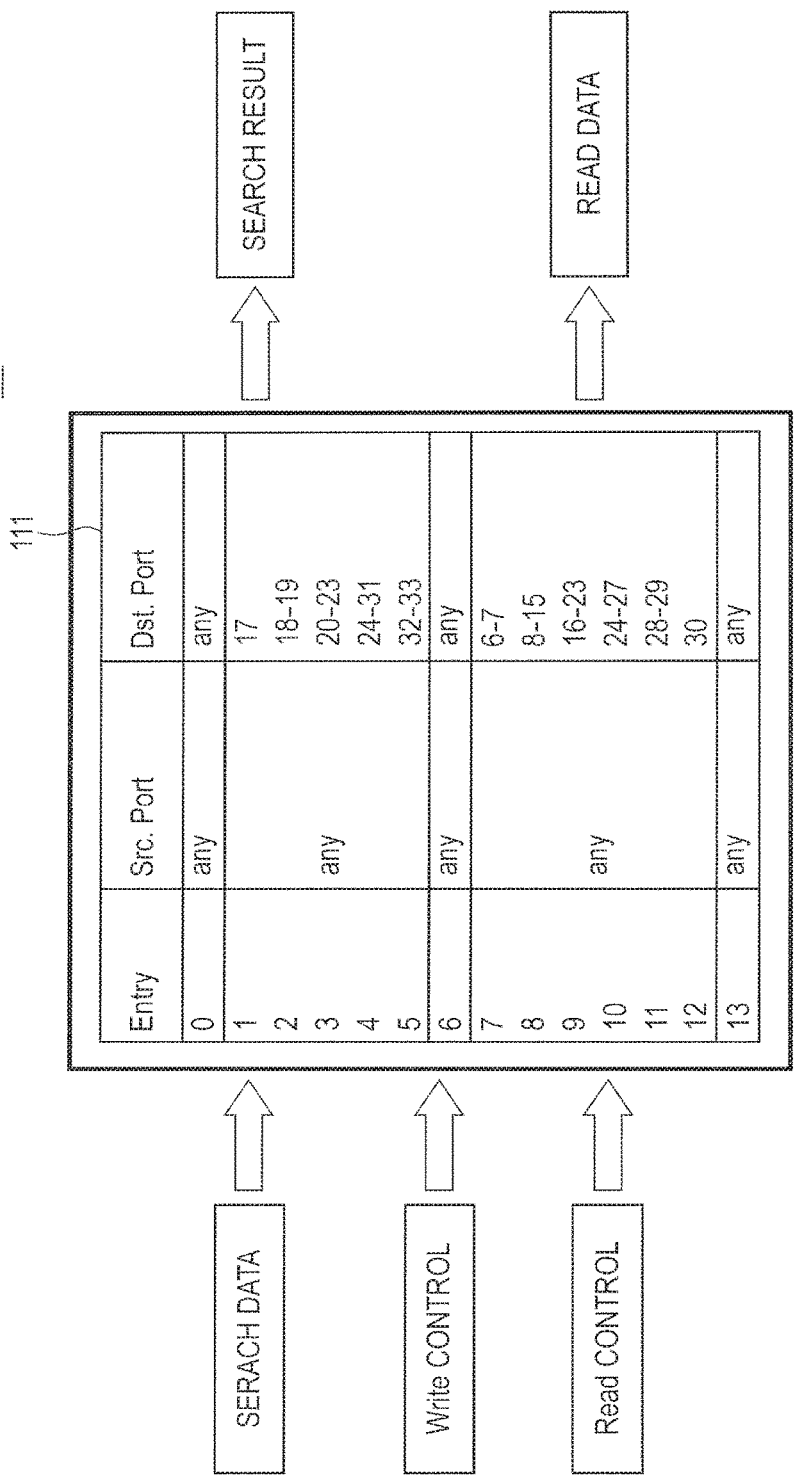
FIG. 9 is a block diagram illustrating a configuration example of the first associative memory in FIG. 7A.
Figure 10:
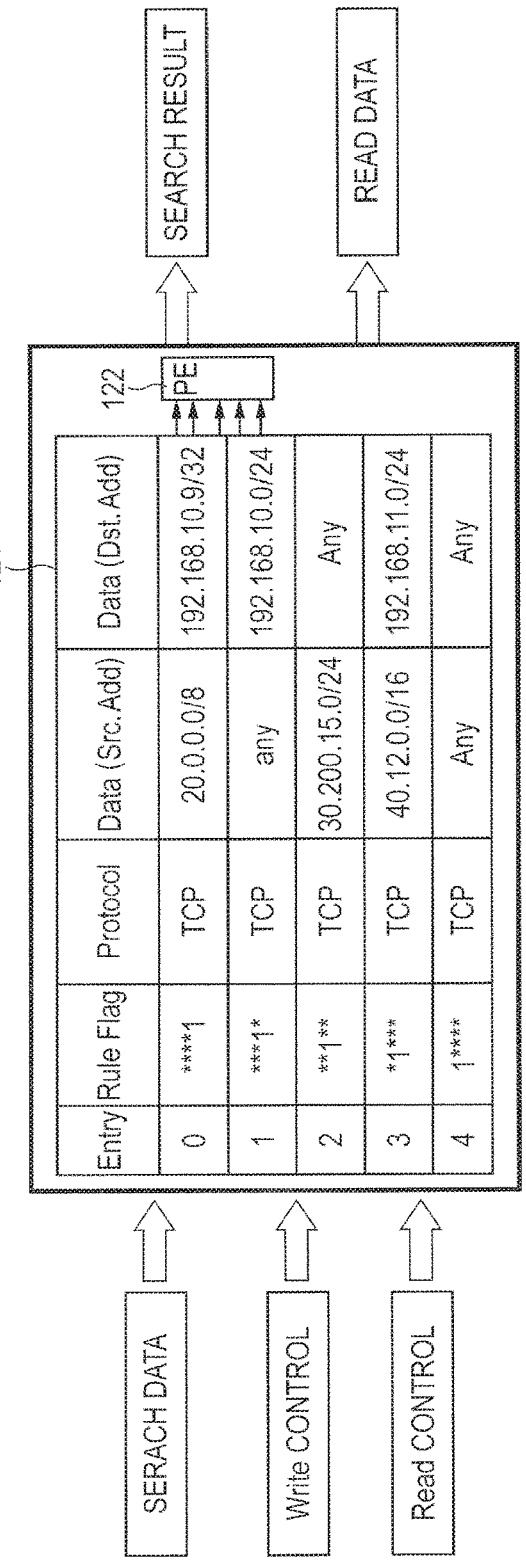
FIG. 10 is a block diagram illustrating a configuration example of the second associative memory in FIG. 7A.

Next, functions of an associative memory are described, referring to FIGS. 9 and 10. FIG. 9 illustrates the first associative memory. FIG. 10 illustrates the second associative memory.

The first associative memory 11 and the second associative memory 12 each have a writing function and a reading function in addition to a search function for an associated one of memory units 111 and 121. The network control device 2 stores search object data in the associative memory by Write-series control in accordance with a predetermined data setting procedure in advance, thereby configuring a database in each of the first associative memory 11 and the second associative memory 12. The Write-series control contains a control signal, an address, and writing data. The first associative memory 11 and the second associative memory 12 each have a function of comparing this database and search data (a search key) with each other and, when there is data matching the search data, outputting information on an address (a search result) in which the matched data is stored. Also, the first associative memory 11 and the second associative memory 12 each have a function of reading the contents of the stored database by Read-series control from the network control device 2, and outputting read data. The read-series control contains a control signal and an address. Search data for the first associative memory 11 is the first search key, and search data for the second associative memory 12 is the second search key. The search result of the first associative memory 1 is multi-hit information, a hit address, a hit counter, or the like, and the search result of the second associative memory 12 is multi-hit information, a hit address, a hit counter, or the like.

The first associative memory 11 outputs a plurality of pieces of hit information (multi-hit information) when a plurality of pieces of match information are obtained. The search result obtained by the first associative memory 11 is compressed by the concatenated search data generating unit 13, and is transmitted to the search key generating unit 14 in which the transmitted search result is used for generation of the second search key. The concatenated search data generating unit 13 puts the plural pieces of hit information into one and transmits it to an associative memory in a next stage. Due to this configuration, it is possible to suppress increase of the data amount during data transmission, and much information for concatenating a plurality of search results is no longer necessary. Therefore, it is no longer necessary to reconstruct data for concatenating the search results when a search table is updated.

The second associative memory 12 checks whether there is matched data by using the second search key that is generated by the search key generating unit 14 based on information on the result of the search at the first step. When only one piece of match information is obtained, an address of thereof is output without being changed. When data is matched in a plurality of addresses, one of the addresses, which has the highest priority (an LSB address is described as an example in the illustrated example), is output via the priority encoder 122. The number of entries in the second associative memory 12 (L) is less than the number of entries in the first associative memory 11 (M).

The hit address output by the second associative memory 12 is finally used as a read address (or a base for address information) in the action memory unit 20 in order to determine processing for input data. Data, such as operation information, preprogrammed in the action memory unit 20 is read out, and a result is transmitted to the network control device 2. With this, a series of operations can be completed.

Figure 11:
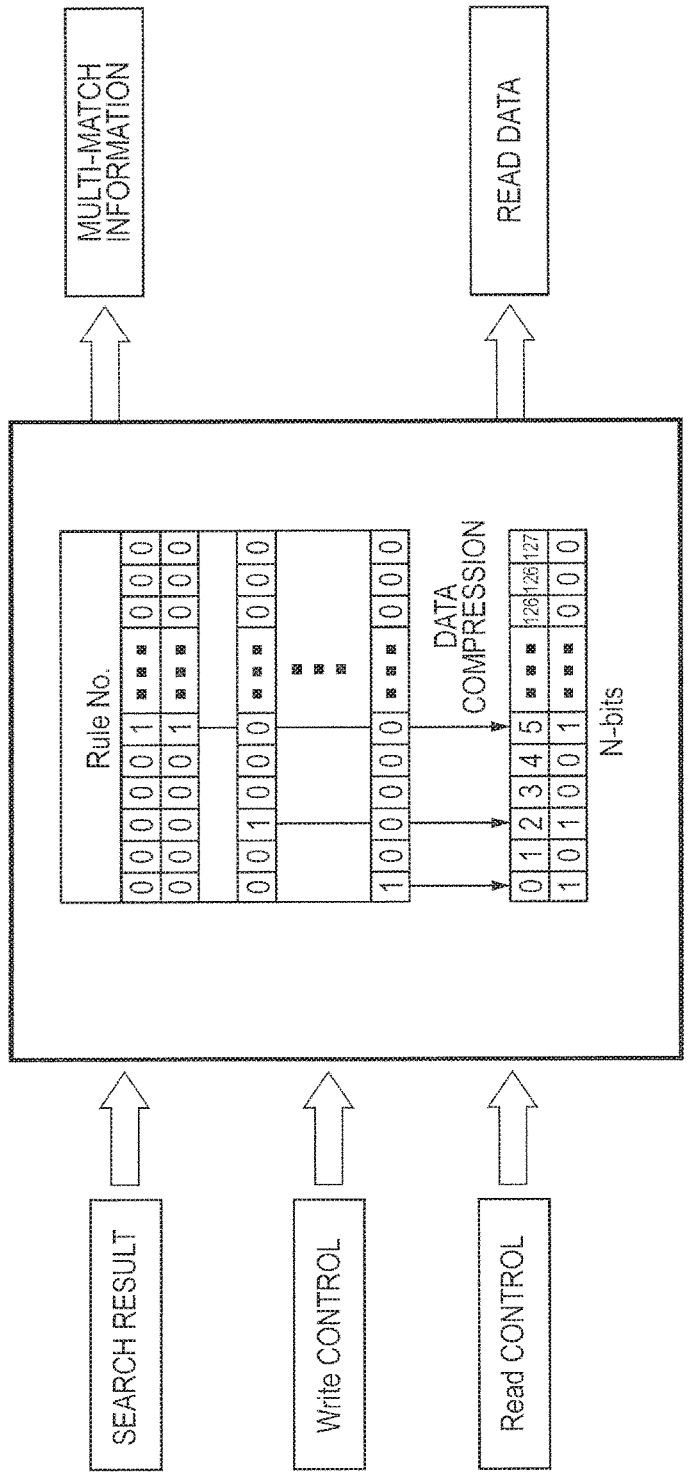
FIG. 11 is a block diagram illustrating a configuration example of the concatenated search data generating unit in FIG. 7A.

Next, functions of the concatenated search data generating unit are described, referring to FIG. 11. FIG. 11 illustrates the concatenated search data generating unit.

The concatenated search data generating unit 13 includes a writing function and a reading function in addition to a data compressing function. The network control device 2 stores a rule number by a Write-series control in accordance with a predetermined data setting procedure in advance to configure the data compressing function in the concatenated search data generating unit 13. The Write-series control contains a control signal, an address, and write data. The concatenated search data generating unit 13 has a function of outputting multi-match information (a hit rule flag, rule information, classification information, a Hash value, or the like) that is the first search information by an access to this rule number by an output (hit information or an index) of the first associative memory 11. The concatenated search data generating unit 13 also has a function of reading the rule number stored therein by a Read-series control from the network control device 2 and outputting reading data. The Read-series control controls a control signal and an address.

Figure 12:
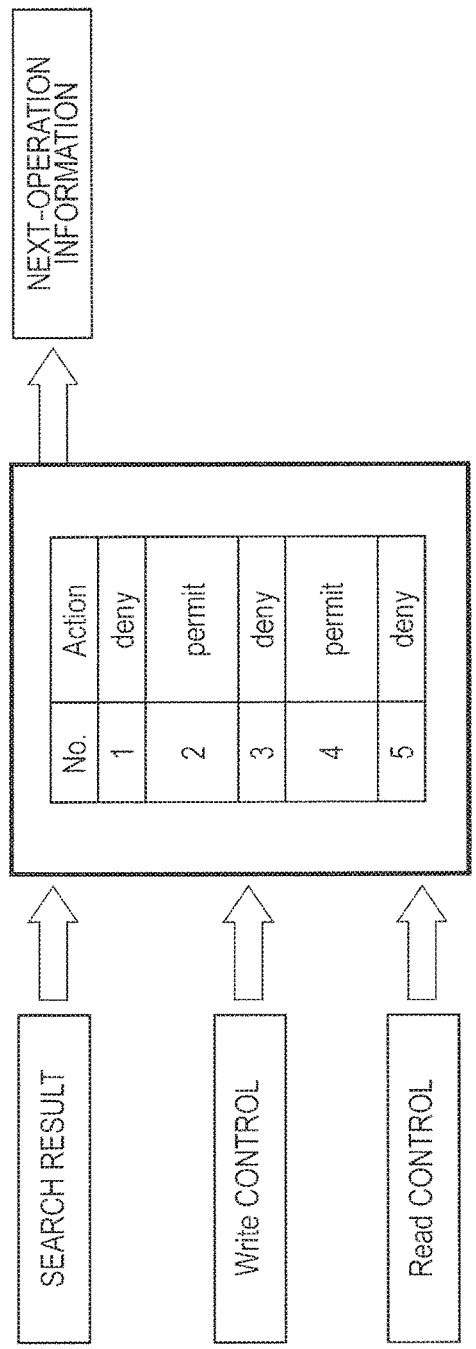
FIG. 12 is a block diagram illustrating a configuration example of the action memory portion in FIG. 7A.

Next, functions of the action memory unit are described, referring to FIG. 12. FIG. 12 illustrates the action memory unit.

The action memory unit 20 is provided with a writing function and a reading function. The network control device 2 stores actions in the action memory unit 20 by Write-series control in accordance with a predetermined data setting procedure in advance. The Write-series control contains a control signal, an address, and write data. The action memory unit 20 has a function of outputting next-operation information (Deny, Permit, or the like) by an access to this action by an output of the second associative memory 12 (hit information or an index). The action memory unit 20 also has a function of reading a stored action by Read-series control from the network control device 2 and outputting read data. The Read-series control contains a control signal and an address. The action memory unit 20 is stored in an internal memory within the associative memory or an external memory, such as a QDR SRAM or a DDR SDRAM, for example.

Next, configuration examples of the concatenated search data generating unit 13 are described, referring to FIGS. 13 to 17. Each of these configuration examples is provided with a mechanism for allowing the concatenated search data generating unit to be programmable (functions of a write circuit, a register, a fuse circuit, a circuit that enables setting by an external signal, and the like) in advance, although the description of the mechanism is omitted for simplifying the description.

Figure 13:
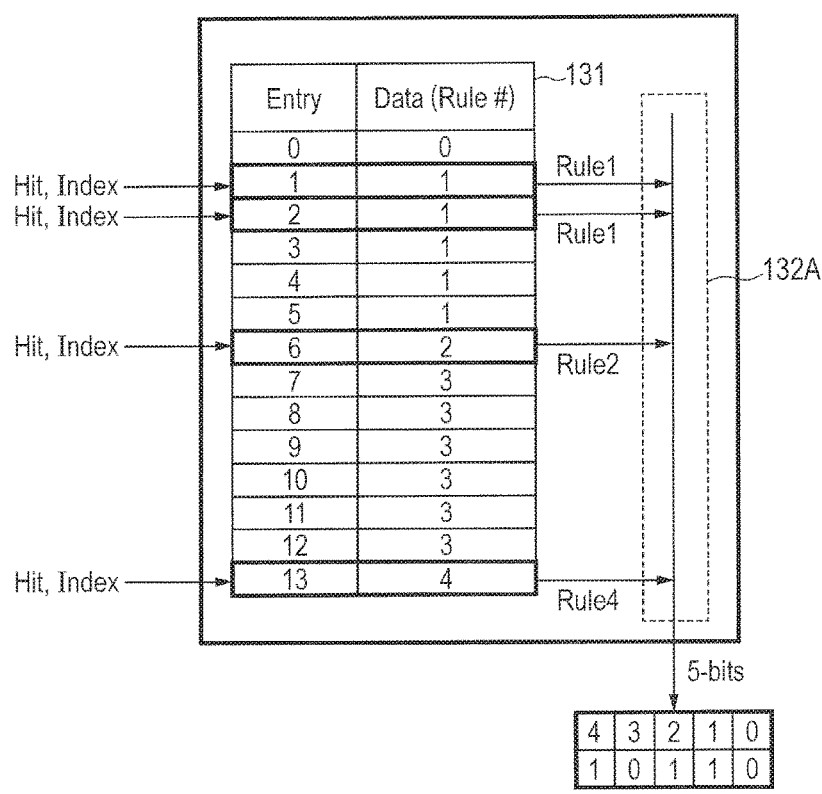
FIG. 13 illustrates a first example of the concatenated search data generating unit in FIG. 11.

FIG. 13 illustrates a first configuration example of the concatenated search data generating unit. A concatenated search data generating unit 13A according to the first configuration example includes a memory unit 131 and a compressing circuit 132A. In this configuration example, the concatenated search data generating unit 13A is achieved by a configuration in which it is programmed in advance in the memory unit 131 which rule number is to be output when a search result output from the first associative memory 11 is received, in such a manner that each entry of the first associative memory 11 corresponds to a rule number.

Output data sometimes includes multiple hits in terms of a relation between a search result (a Hit and an Index) in the first associative memory 11 and data stored in the memory unit 131. In that case, multiple-hit information is compressed into data the number of pieces of which is a preset number of rules. While 14 hits occur at maximum because the number of entries is 14 in FIG. 13, the hits are compressed to 5 that is the number of rules. The number of entries and the number of rules are not limited to these values. As a compression method in the compressing circuit 132A, a method of logically obtaining OR or NOR and a method of achieving compression by Wired-OR or Wired-NOR can be applied. In the illustrated example, a plural pieces of hit information for Rule number 1 (Rule #1), and it is found that these pieces of hit information are put into one bit. Further, it is possible to compress the multi-hit information also by configuring the compressing circuit by a cross-bar switch and programming the cross-bar switch to obtain a desired switch coupling state.

Figure 14:
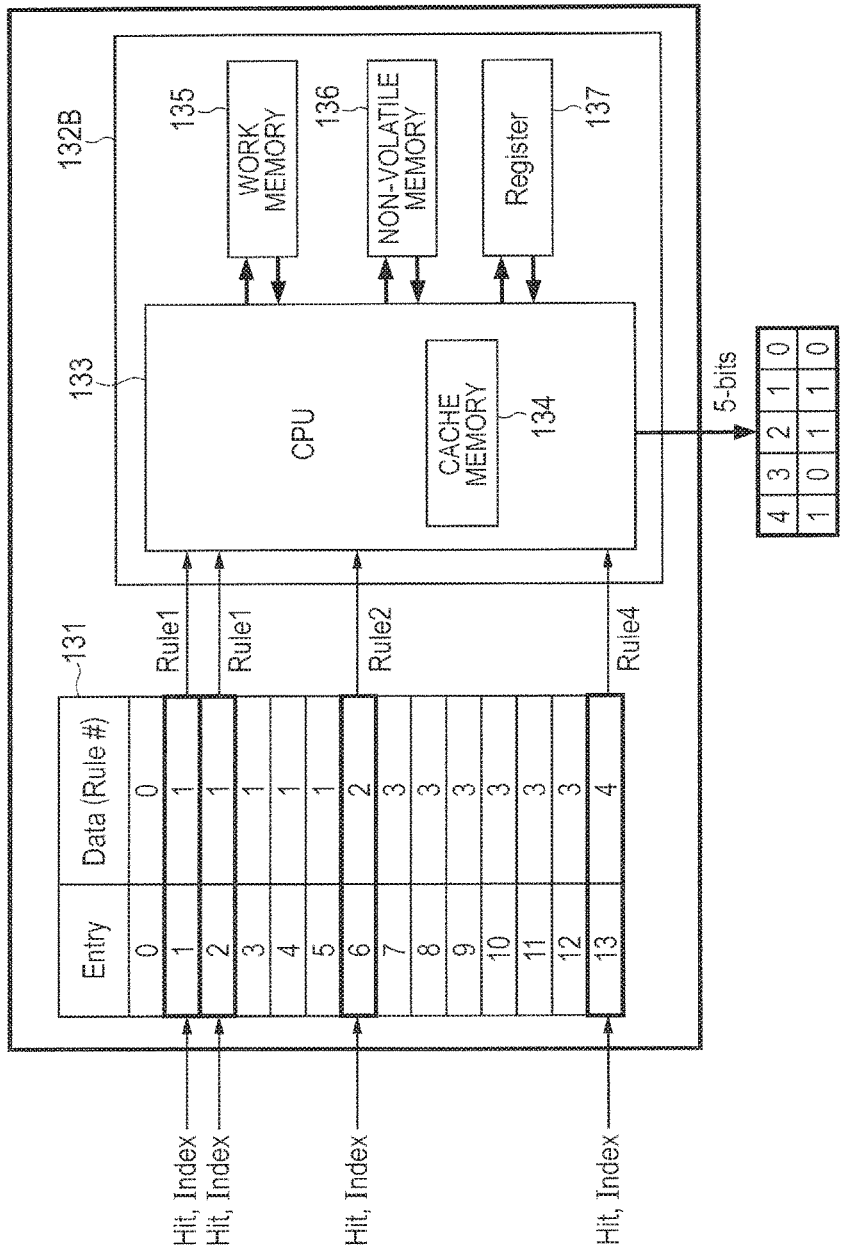
FIG. 14 illustrates a second example of the concatenated search data generating unit in FIG. 11.

FIG. 14 illustrates a second configuration example of the concatenated search data generating unit. A concatenated search data generating unit 13B according to the second configuration example includes the memory unit 131 and a compressing circuit 132B. While 14 hits occur at maximum because the number of entries is 14 as in the first configuration example, the compressing circuit 132B performs compression to 5 that is the number of rules. The number of entries and the number of rules are not limited to these values. The compressing circuit 132B includes a CPU 133 including a cache memory 134, a work memory 135, a non-volatile memory 136, and a register 137. Compression of data in accordance with a rule preprogrammed in the register 137 on a rule-by-rule basis, each rule corresponding to a hit entry, and outputting the compressed data are performed by software processing that uses the CPU 133, the cache memory 134 storing a program, and the work memory 135 storing data. The work memory 135 in this processing may be an incorporated type or an external type. Further, in order to make the processing performed in the CPU 133 easier, appropriate encoding processing (e.g., encoding processing that uses a Hash function or a decoder) may be performed for the multi-hit information output from the first associative memory 11. Furthermore, it is possible to configure a mechanism that can load a program and a rule that are required to be set in advance, by adding the non-volatile memory 136. The work memory 135 and the non-volatile memory 136 in this processing may be an internal type or be provided outside the system.

Figure 15B:
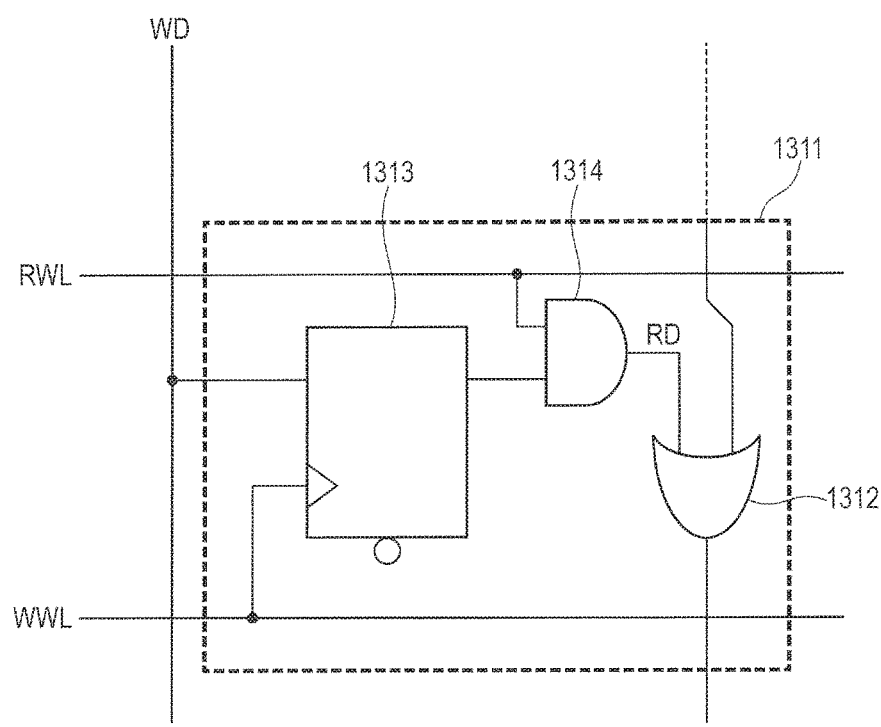
FIG. 15B illustrates a configuration of a memory-grid like register in FIG. 15A.

FIG. 15A illustrates a third configuration example of the concatenated search data generating unit. FIG. 15B is a circuit diagram illustrating a configuration of a memory-grid like register in FIG. 15A.

A concatenated search data generating unit 13C according to the third configuration example includes a memory unit 131C, a write circuit 138, and a register 139. The memory unit 131C associates a search result corresponding to an entry of the associative memory 11 and the concatenated search data generating unit 13C with each other, sets a flag in a memory-grid like register 1311 at a portion that corresponds a hit entry for a rule number associated with a preprogrammed entry, and performs logical compression for every flag associated with the rule. The logical compression is configured by OR circuits 1312 in daisy-chain coupling along a vertical direction of an array configuration. The memory-grid like register 1311 is configured by a D-flip flop 1313, an AND circuit 1314, and the OR circuit 1312 as a minimum unit of an element in such a manner that, for every entry in the associative memory, a corresponding flag can be programmed. An output signal of the OR circuit 1312 in one upper stage is input to an input of a certain OR circuit 1312 of the memory-grid like register 1311, and an output of the certain OR circuit 1312 is input to an OR circuit 1312 in one lower stage. To an OR circuit 1312 in the uppermost stage, Low is input. In the illustrated example, the memory-grid like registers 1311 are arranged to correspond to N bits in a horizontal direction and M entries (in a case where the number of entries in the concatenated search data generating unit 13C is M that is the same as the number of entries in the associative memory) at maximum in the vertical direction. N represents the number of rules or categories for classification. A value of N may be variable, as long as it is 2 or more. M hits occur at maximum, and are compressed by the compressing circuit into N pieces of data. Therefore, the number of rules or categories (N) is smaller than the number of entries (M) in the associative memory.

In this configuration, a RWL (Read Word Line) of the memory unit 131C is coupled to a match out signal of the associative memory 11 directly or via a buffer. In order to program "1" while a WWL (Write Word Line) is set to be High in advance, a write circuit 138 is controlled to place WD (Write Data) at a High level. Also, in order to program "0", the write circuit 138 is controlled to place the WD (Write Data) at a Low level. By this control, it is possible to store data in the D-flip flop 1313.

"1" is stored in the D-flip flop 1313 in order to activate a flag in the memory-grid like register 1311 as an object at a portion that corresponds to a rule number to be programmed. By this, when the RWL becomes High, that is, the coupled match out signal becomes High (is placed at a Hit state), RD (Read Data) becomes High, so that an output of an OR circuit 1312 also becomes High and a flag is generated and stored in the register 139.

In a case where coupling on an entry-by-entry basis is impossible or difficult because of a hardware configuration, signals are put together in beach block, and entries in the associative memory are put into some blocks are coupled to the concatenated search data generating unit as match out signals. I this case, it is possible to apply this configuration example by performing processing that makes each block includes the same rule in advance, for example, in a method for storing data in the associative memory and making the data storing method correspond to a coupling method.

In addition, in a case of using a TCAM as the associative memory, a match amplifier (Match Amp) output of the TCAM or something logically equivalent thereto is coupled to the concatenated search data generating unit by a pipeline. This configuration enables the search operation to be performed while a search throughput is unchanged. This configuration is also effective in a long key search.

FIG. 16 illustrates a first modified example of the memory-grid like register 1311 of FIG. 15B. A memory-grid like register 1311D according to the first modified example is configured to include less elements than the memory-grid like register 1311 of FIG. 15B, and can have a reduced layout area.

In this configuration, a RWL (Read Word Line) of the memory-grid like register 1311D is coupled to a match output signal of the associative memory 11 directly or via a buffer. In order to program "1" while a WWL (Write Word Line) is set at a High level in advance, WD (Write Data) is controlled to be at a High level. In order to program "0", /WD (Write Data Bar) is controlled to be at a High level. With this control, it is possible to store data in a latch unit formed by an inverter IN1 and an inverter IN2 between a transistor N1 and a transistor N2.

In a memory-grid like register 1311D that is an object, "1" is stored in its latch unit in order to activate a flag at a portion corresponding to a rule number to be programmed. Thus, when the RWL becomes High, that is, the coupled match output signal becomes High (is placed at a His state), RD (Read Data) becomes Low. In a case where the RD is pre-charged at a High potential in advance, the RD becomes Low when there is a path through which electric charges are drawn to the GND (that is, through which transistors N3 and N4 are conductive) in the memory-grid like registers 1311D coupled to the RD, so that an output signal of a comparator CMP (/ORing) becomes Low and a flag can be generated. In this modified example, a data merging operation is achieved by Wired-NOR.

Figure 17:
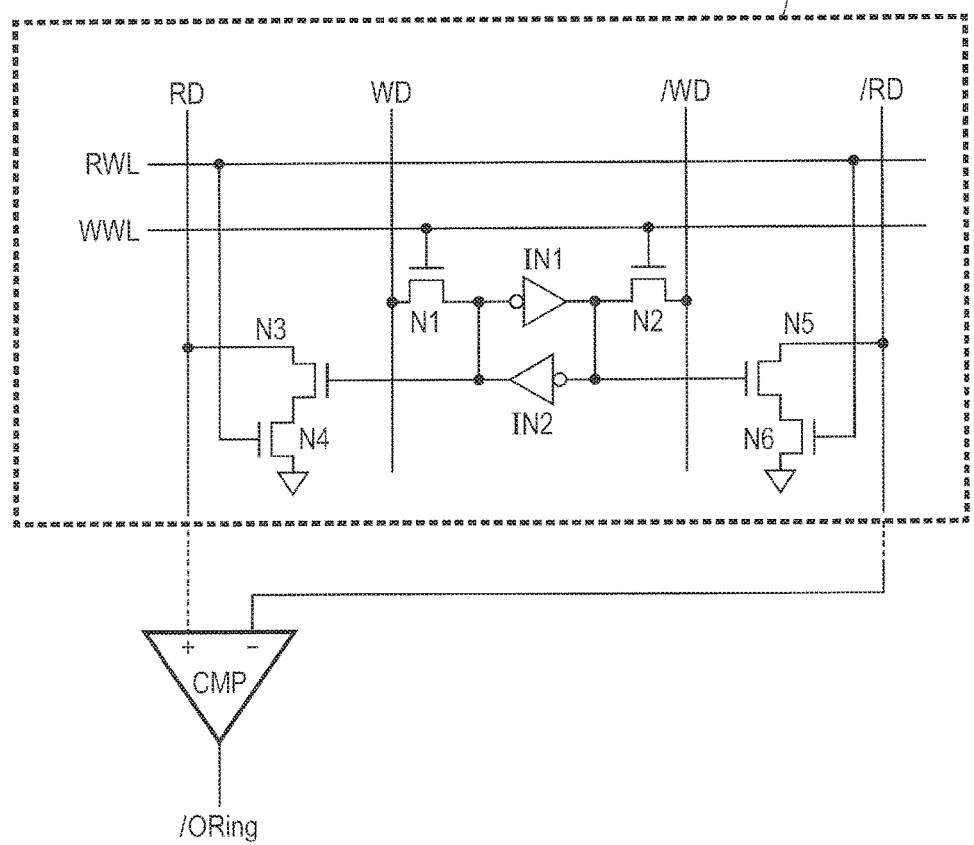
FIG. 17 illustrates a second modified example of the memory-grid like register in FIG. 15B.

FIG. 17 illustrates a second modified example of the memory-grid like register of FIG. 15B. The memory-grid like register 1311D according to the first modified example has to separately generate a level for comparison, called a reference voltage (Vref), that is a reference voltage in data comparison in order to detect a level of the RD. On the other hand, a memory-grid like register 1311E according to the second modified example employs a configuration that compares levels of complementary buses for the RD and /RD (Read Data Bar), so that a circuit for generating the reference voltage (Vref) is no longer necessary. The /RD is coupled to GND via transistors N5 and N6.

Next, examples of coupling of the associative memory unit 10 in FIG. 7A, that is, an associative memory 11 at the first stage (a top associative memory 11), the concatenated search data generating unit 13, and the associative memory 12 at the n-th stage (a final stage) is described, referring to FIGS. 18 to 23.

Figure 18:
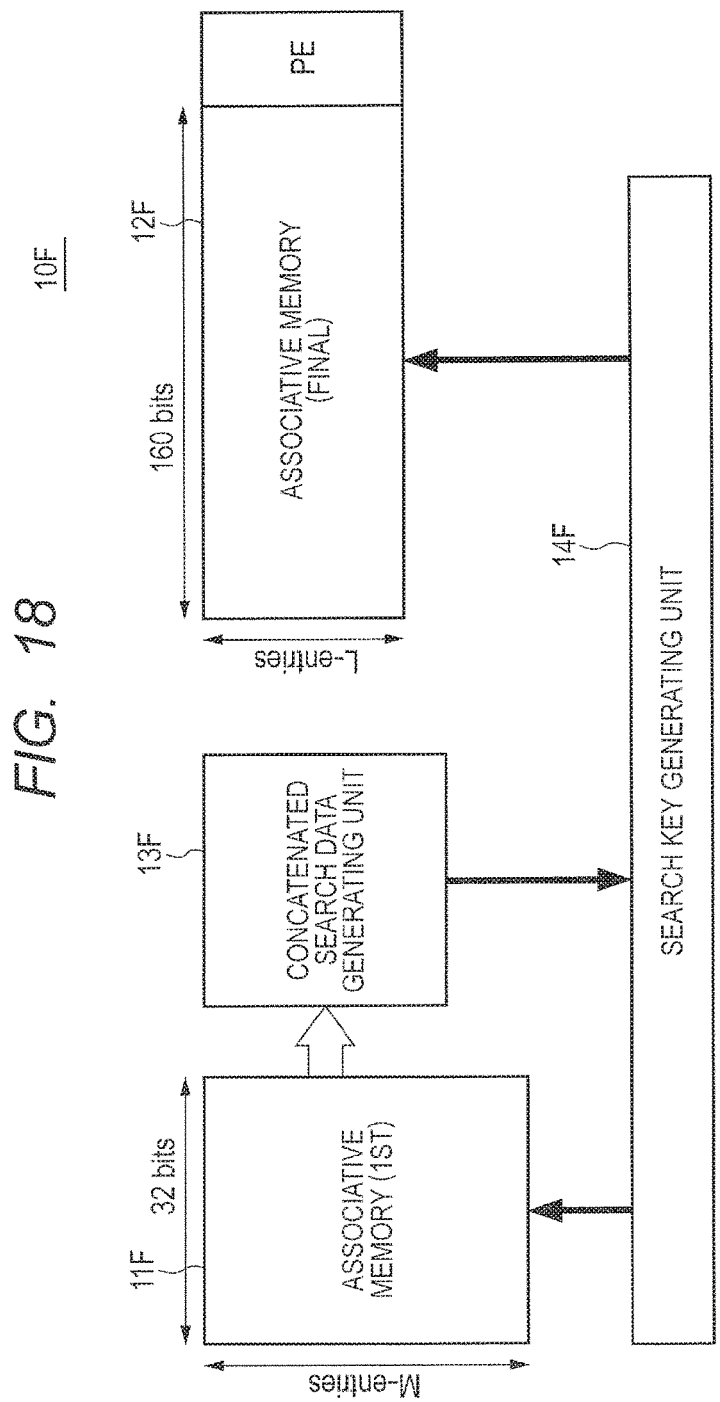
FIG. 18 illustrates an associative memory portion according to a first coupling example.

FIG. 18 illustrates an associative memory unit according to a first coupling example. An associative memory unit 10F is configured by coupling a plurality of associative memories 11F and 12F that are different in an array size from each other in series. The associative memory unit 10F includes an associative memory 11F at the first stage, an associative memory 12F at a final stage, a concatenated search data generating unit 13F, and a search key generating unit 14F. The associative memory 12F at the final stage includes a priority encoder (PE).

In the associative memory 11F at the first stage, data using a 3-(Ternary) value in a range expression, such as a port number, is stored. A search in the associative memory 12F at the final stage is performed for data other than that data. In a search at the first stage, it is possible to suppress the memory usage by performing the search using 32 bits in total, because each of a source port number and destination port number is 16 bits.

Further, by employing a configuration in which when an array size is reduced, the number of entries can be increased in proportion to the reduction of the array size (a configuration that can switch a balance between the horizontal size and the vertical size: e.g., the associative memory is formed by a memory-array block in which 32 bits×M entries and 160 bits×L entries have the same size), it is possible to easily obtain balanced memory usage because data of a portion for which a range is expanded requires more entries than data description of another portion not requiring range expansion. Therefore, it is possible to efficiently use the memory. Note that a relation L<M is satisfied. Although a case in which L is smaller than M is described in FIG. 18, the relation between L and M is not limited thereto. A relation L≥M may be satisfied. In this case, the number of bits of one entry in the associative memory 11F at the first stage is equal to or larger than the number of bits of one entry in the associative memory 12F at the final stage.

Figure 19:
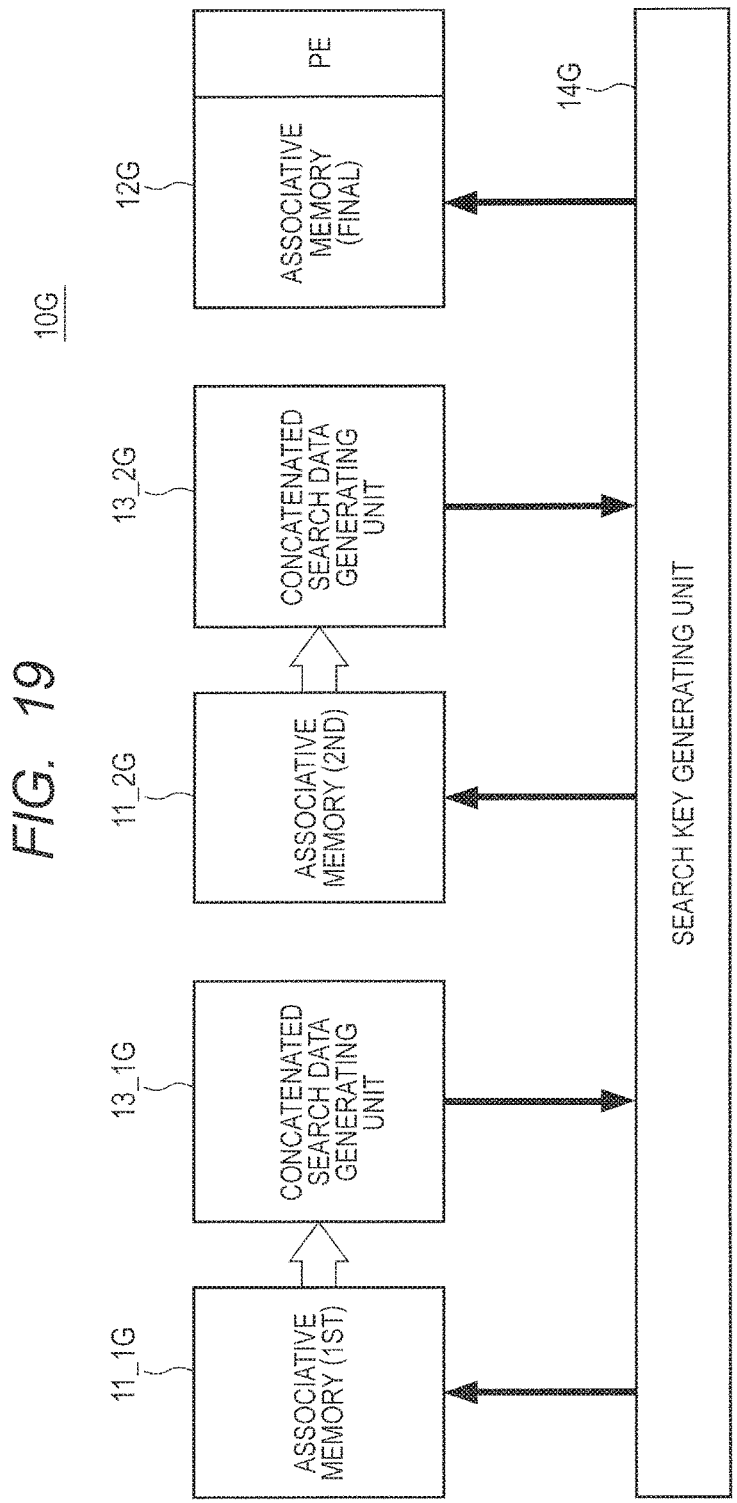
FIG. 19 illustrates an associative memory portion according to a second coupling example.

FIG. 19 illustrates an associative memory unit according to a second coupling example. An associative memory unit 10G is configured by concatenating three search results in series. The associative memory unit 10G includes an associative memory at the first stage 11_1G, an associative memory at the second stage 11_2G, an associative memory at the final stage 12G, a concatenated search data generating unit at the first stage 13_1G, a concatenated search data generating unit at the second stage 13_2G, and a search key generating unit 14G. The associative memory at the final stage 12G has a priority encoder (PE).

By coupling three or more associative memories in this manner, instead of coupling only two associative memories, it is possible to achieve a long key search that could not be achieved conventionally.

Figure 20:
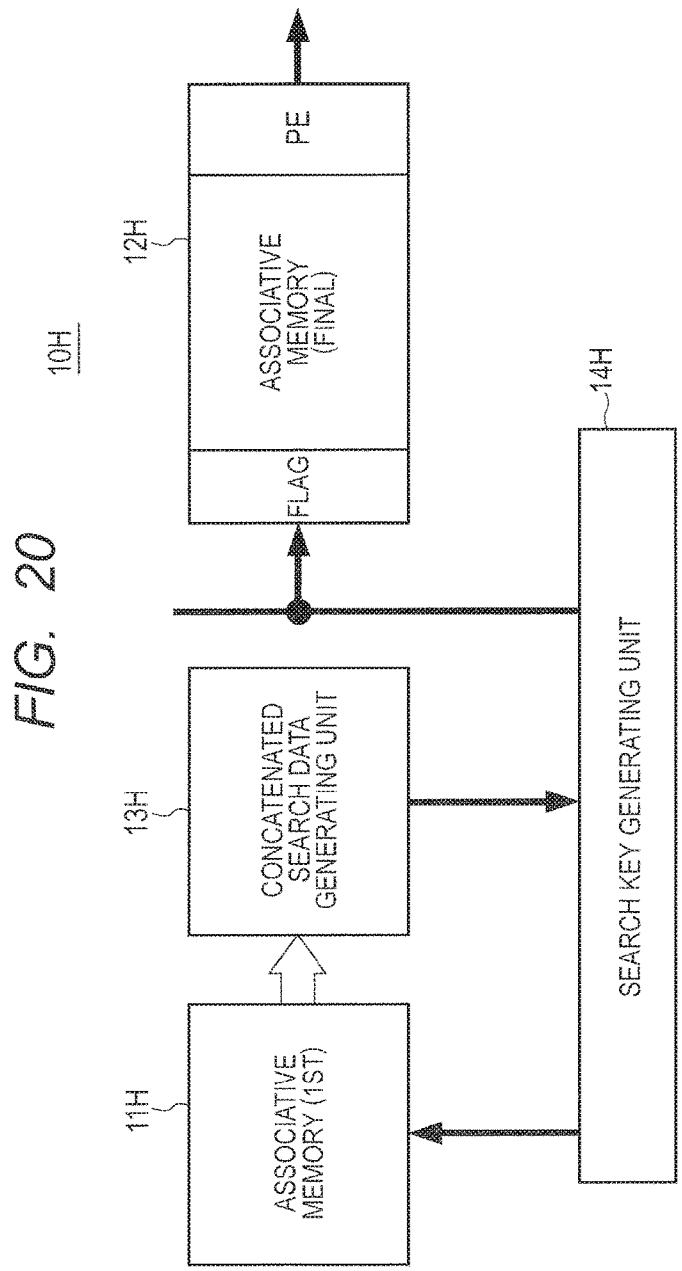
FIG. 20 illustrates an associative memory portion according to a third coupling example.

FIG. 20 illustrates an associative memory unit according to a third coupling example. An associative memory unit 10H is configured by embedding data (a flag) for concatenating a table within the table in an associative memory at a final stage 12H. The third coupling example employs the same configuration as that of the associative memory unit 10.

Figure 21:
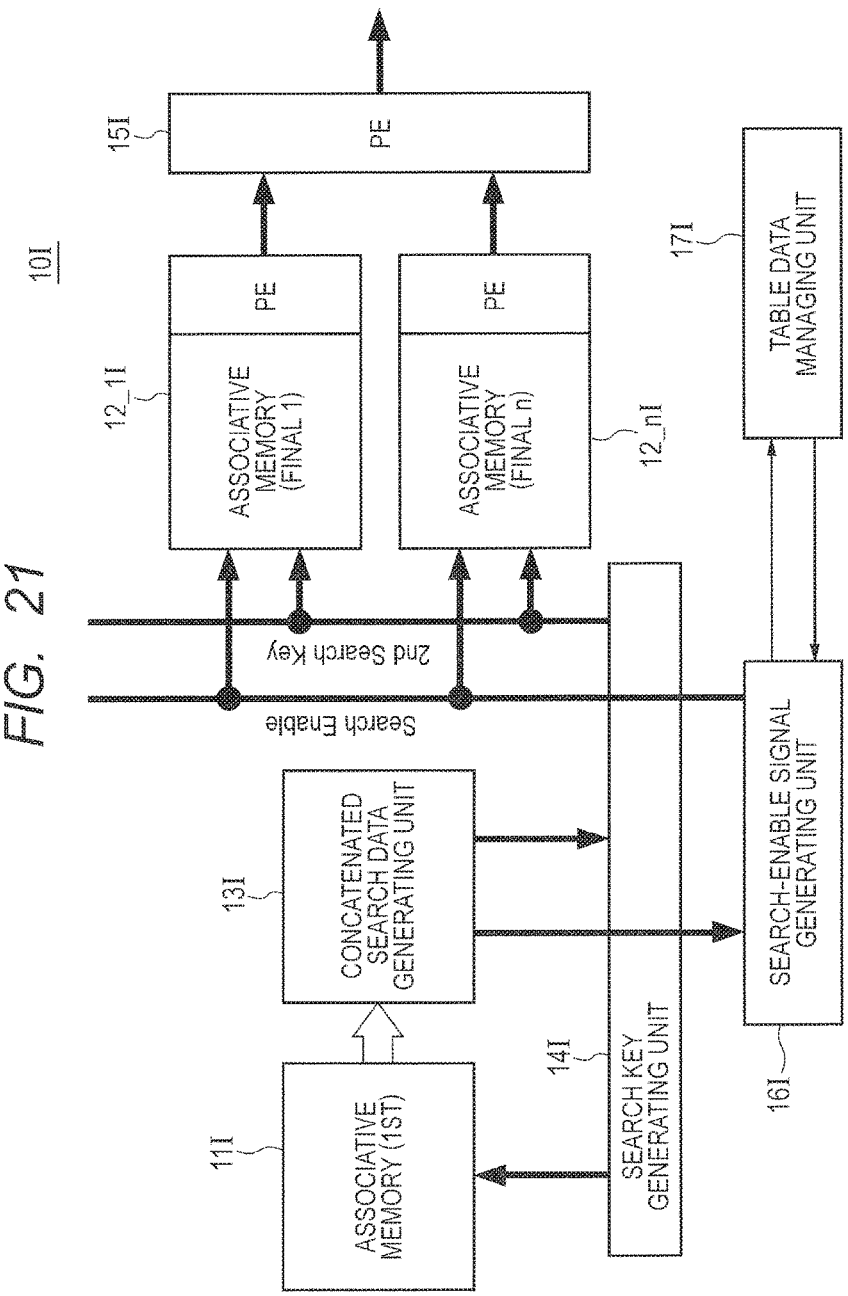
FIG. 21 illustrates an associative memory portion according to a fourth coupling example.

FIG. 21 illustrates an associative memory unit according to a fourth coupling example. An associative memory unit 10I is configured by concatenating concatenated search data from one associative memory to a plurality of associative memories. The associative memory unit 10I includes an associative memory at the first stage 11I, associative memories at the final stage 12_1I, . . . , 12_nI, a concatenated search data generating unit 13I, a search key generating unit 14I, a priority encoder (PE) 15I, a search enable signal generating unit 16I, and a table data managing unit 17I. Each of the associative memories at the final stage 12_1I, . . . , 12_nI includes a priority encoder (PE).

In order to achieve this method, a hit address is transmitted from the concatenated search data generating unit 13I to the search enable signal generating unit 16I, so that the search enable signal generating unit 16I inquires the table data managing unit 17I about concatenation information of a table to which a hit index belongs, and the table data managing unit 17I transmits the concatenation information to the search enable signal generating unit 16I. The search enable signal generating unit 16I selects an associative memory at the final stage that stores a database that is an object, by a search enable signal and activates that associative memory. Further, the search key generating unit 14I transmits the second search key to the first associative memory at the final stage (final 1) 12_13 1I, . . . , the n-th associative memory at the final stage (final n) 12_nI in parallel, and the associative memory activated by the search enable signal performs a search operation.

The search result is transmitted to a priority encoder (PE) included in each associative memory activated by the search enable signal, so that an address with the highest priority is selected. Further, addresses respectively having priorities between the associative memories are transmitted to the priority encoder (PE) 15I at the next stage, so that a final hit address is determined. With this method, it is possible to achieve expansion in a case where table data in the associative memory at the final stage becomes too large to be stored in a single memory block. Because there is an associative memory that is not activated by the search enable signal, low power consumption can be achieved. In a case where two associative memories are provided at the final stage, either one of the search enable signal (the search enable signal generating unit 16I and the table data managing unit 17I) and the priority encoder (PE) 15I can be omitted.

Figure 22:
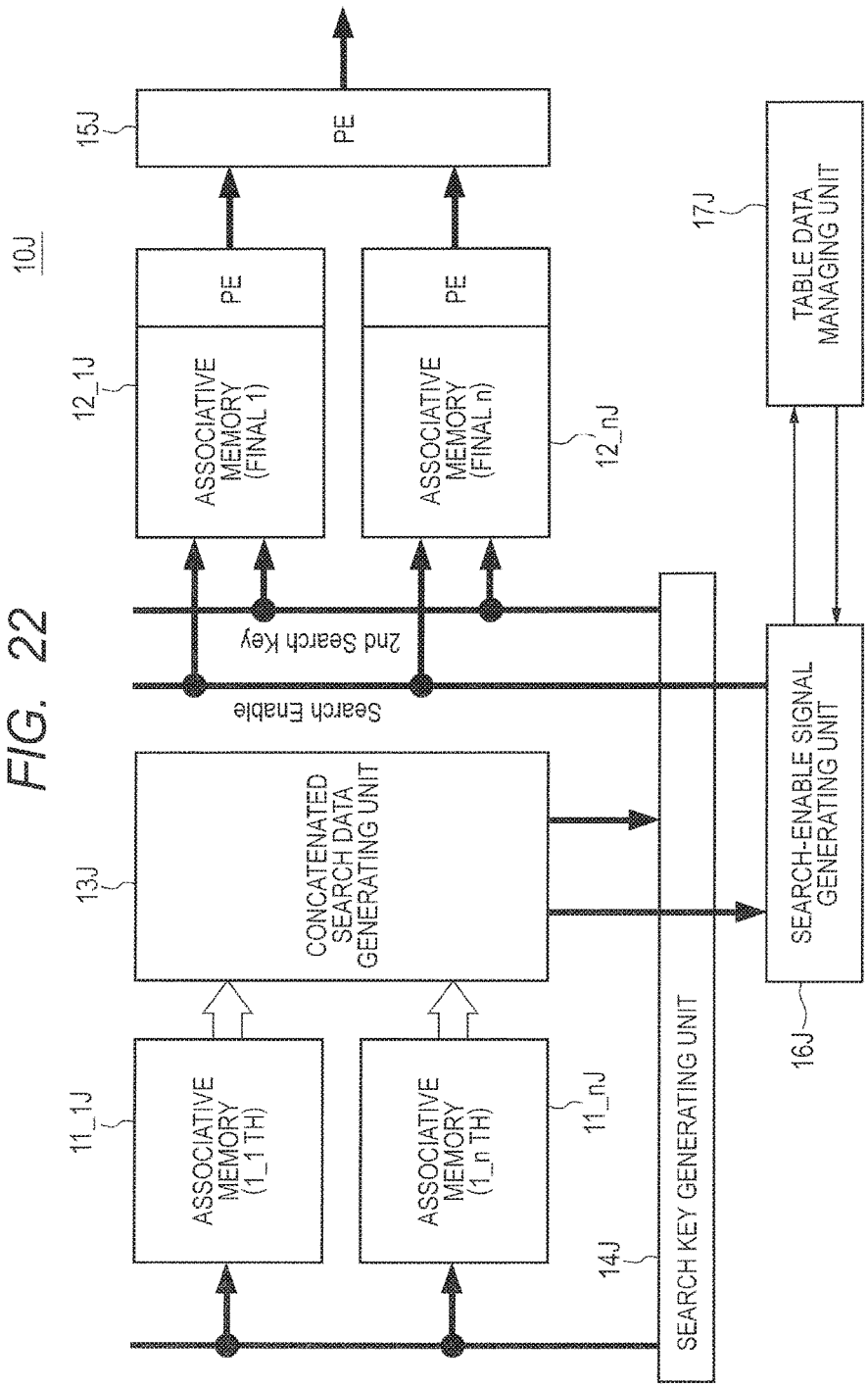
FIG. 22 illustrates an associative memory portion according to a fifth coupling example.

FIG. 22 illustrates an associative memory unit according to a fifth coupling example. An associative memory unit 10J is configured by concatenating a plurality of search results to a plurality of blocks in series. The associative memory unit 10J includes associative memories at the first stage 11_1J, ..., 11_nJ, associative memories 12_1J, ..., 12_nJ, a concatenated search data generating unit 13J, a search key generating unit 14J, a priority encoder (PE) 15J, a search enable signal generating unit 16J, and a table data managing unit 17J. The associative memories at the final stage 12_1J, ..., 12_nJ each include a priority encoder (PE).

A difference between the fifth coupling example and the fourth coupling example of FIG. 21 is in that search results of the associative memories (the associative memories 11_1J, ..., 11_nJ) are put together at the first stage. The concatenated search data generating unit 13J puts the search result of the associative memories at the first stage together, and sends information for a plurality of associative memories at the second stage (final stage) to the search key generating unit 14J. By achieving this coupling, it is possible to reduce an area and achieve low power consumption because the concatenated search data generating unit can be shared by a plurality of associative memories.

Figure 23:
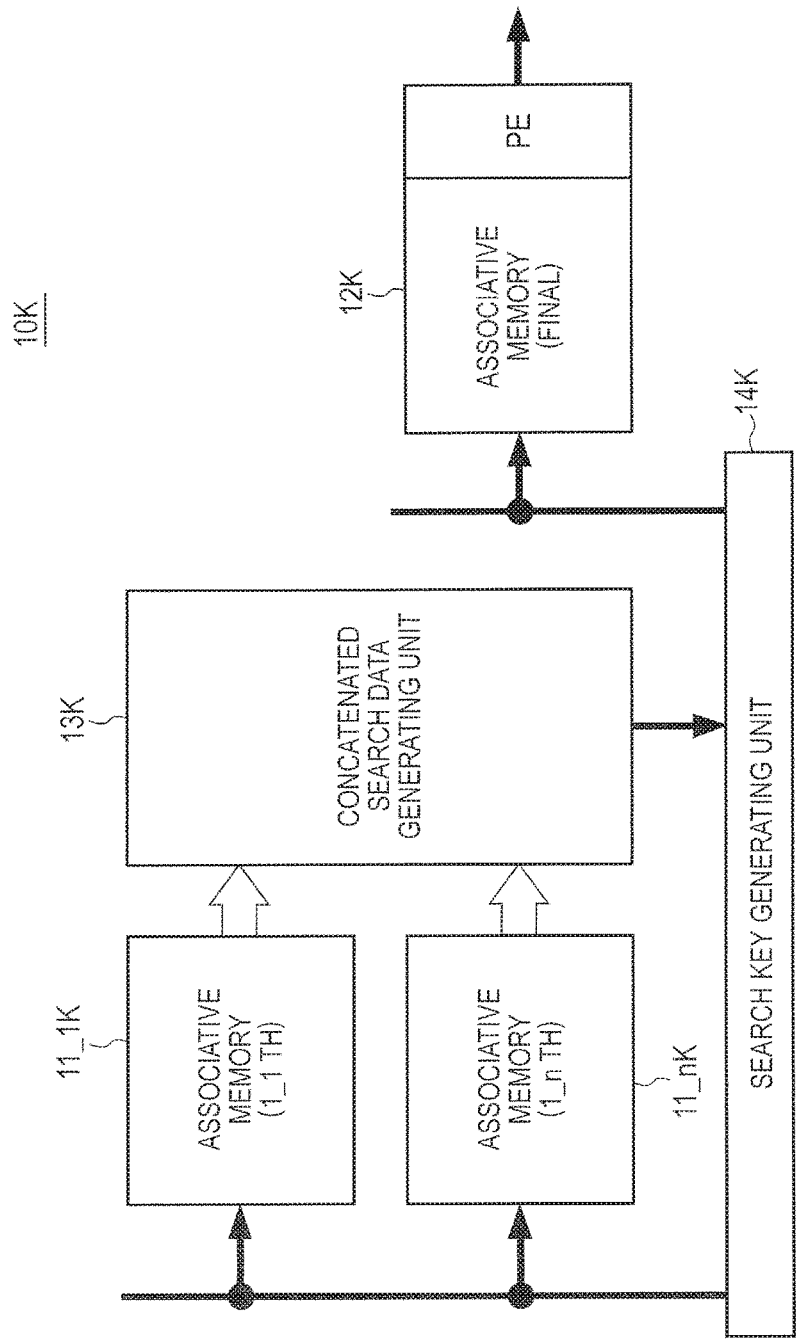
FIG. 23 illustrates an associative memory portion according to a sixth coupling example.

FIG. 23 illustrates an associative memory unit according to a sixth coupling example. An associative memory unit 10K is configured by putting a plurality of search results into one and then coupling it to one associative memory. The associative memory unit 10K includes associative memories at the first stage 11_1K, ..., 11_nK, an associative memory at the final stage 12K, a concatenated search data generating unit 13K, and a search key generating unit 14K. The associative memory at the final stage 12K includes a priority encoder (PE). Data stored in each associative memory may include many range expressions depending on the contents of a rule description in one case, and only the size of a top table (at the first stage) may be large for some conditions including a state of fragmenting the rule, for example. In those cases, a plurality of search results for only the top associative memories are put into one and handed over, and are coupled to the second associative memory (at the final stage). This coupling enables efficient memory use.

Mounting Examples

Figure 24:
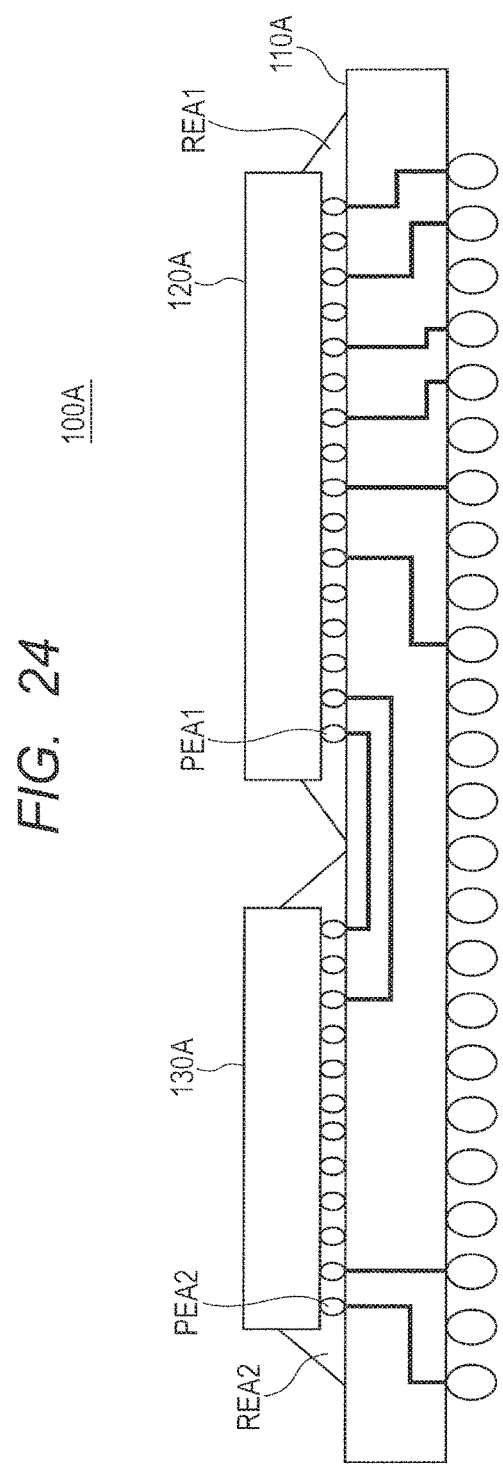
FIG. 24 illustrates a cross-sectional view of a semiconductor device according to a first mounting example.

FIG. 24 illustrates a cross-sectional view of a semiconductor device according to a first mounting example. In a semiconductor device 100A, an associative memory 120A and a concatenated search data generating unit 130A are mounted on the same substrate 110A. The associative memory 120A includes a semiconductor chip including the first associative memory 11 and the second associative memory 12, and is electrically coupled and fixed to the substrate 110A with bump electrodes PEA1. A circuit-forming surface of the semiconductor chip is sealed together with the bump electrodes PEA1 by a resin material, such as a resin REA1. The concatenated search data generating unit 130A includes a semiconductor chip including the concatenated search data generating unit 13, is electrically coupled and fixed to the substrate 110A with bump electrodes PEA2. A circuit-forming surface of the semiconductor chip is sealed together with the bump electrodes PEA2 by a resin material, such as a resin REA2. Each of the associative memory 120A and the concatenated search data generating unit 130A may be ones that have been already sealed with a resin or the like. The search key generating unit 14 may be included in the concatenated search data generating unit 130A or the associative memory 120A.

The concatenated search data generating unit 13 requires a memory for storing a rule for classifying hit information therein in advance. However, for a customer who only wants to keep compatibility with a conventional product, this function may increase the cost. Therefore, the function of the concatenated search data generating unit 13 is arranged outside the chip of the associative memory 120A, so that this function is provided as an option of a package as necessary. This can optimize the cost. The concatenated search data generating unit 130A can be also achieved in a mode in which a logic is added to a generally used memory product, such as a DRAM or an SRAM, and in a mode in which the function of the concatenated search data generating unit is achieved by an FPGA.

Figure 25:
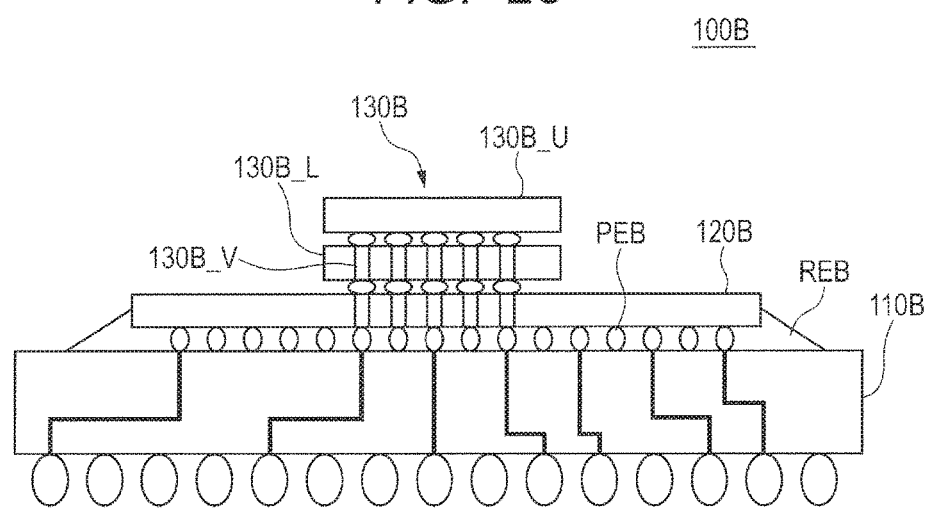
FIG. 25 illustrates a cross-sectional view of a semiconductor device according to a second mounting example.

FIG. 25 illustrates a cross-sectional view of a semiconductor device according to a second mounting example. In a semiconductor device 100B, an associative memory 120B and a concatenated search data generating unit 130B are mounted on a substrate 110B by a 3D mounting technique. The associative memory 120B includes a semiconductor chip including the first associative memory 11 and the second associative memory 12, and is electrically coupled and fixed to the substrate 110B by bump electrodes PEB. A circuit-forming surface of the semiconductor chip is sealed by a resin material, such as resin REB, together with bump electrodes PEB. The concatenated search data generating unit 130B is obtained by electrically coupling two semiconductor chips 130B_U and 130B_L including the concatenated search data generating unit 13 to the associative memory 120B by a TSV (Though Silicon Via) technique (by silicon through via electrodes 130B_V). The search key generating unit 14 may be included in the concatenated search data generating unit 130B or the associative memory 120B.

It is possible to reduce a mounting area by arranging the concatenated search data generating unit 130B on the associative memory 120B. The TSV technique may be replaced with a PonP (Package on Package) technique. When the TSV technique or the PonP technique is applied, it is possible to couple the associative memory 120B and the concatenated search data generating unit 130B with a low latency and reduce a wiring distance. Therefore, a power for signal transmission can be also reduced.

Figure 26:
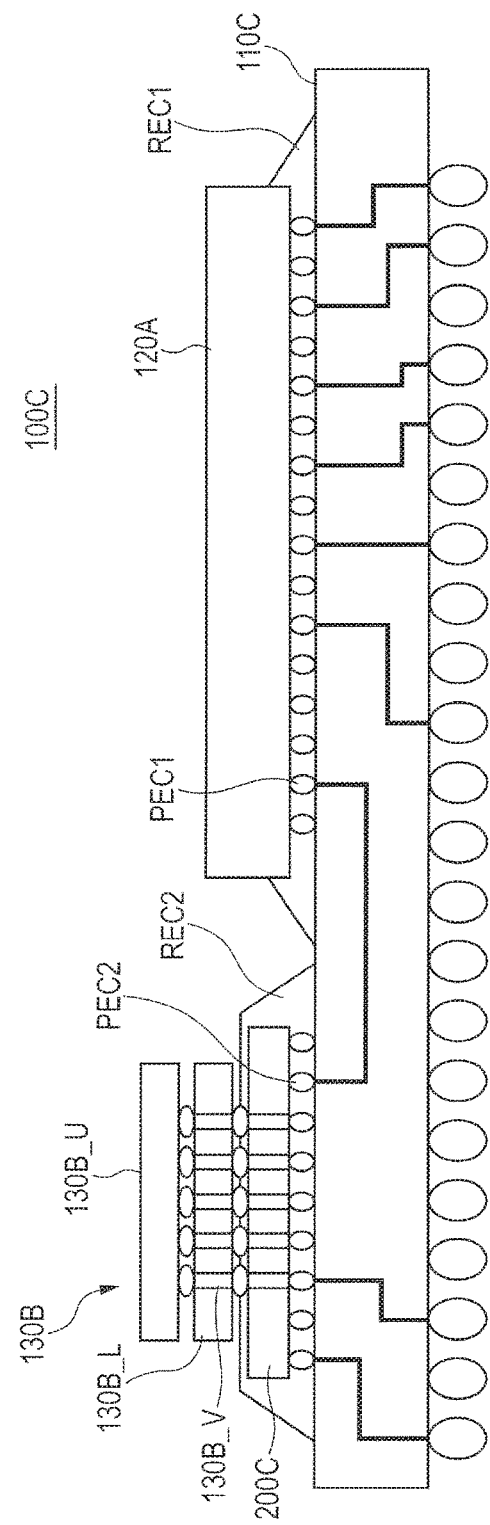
FIG. 26 illustrates a cross-sectional view of a semiconductor device according to a third mounting example.

FIG. 26 illustrates a cross-sectional view of a semiconductor device according to a third mounting example. In a semiconductor device 100C, the associative memory 120A and the concatenated search data generating unit 130B are mounted on the same substrate. The associative memory 120A includes a semiconductor chip including the first associative memory 11 and the second associative memory 12, and is electrically coupled and fixed to a substrate 110C by bump electrodes PEC1. A circuit-forming surface of the semiconductor chip is sealed by a resin material, such as resin REC1, together with the bump electrodes PEC1. In the concatenated search data generating unit 130B, two semiconductor chips 130B_U and 130B_L including the concatenated search data generating unit 13 are electrically coupled to a base die 200C by silicon through via electrodes 130B_V. The base die 200C is a semiconductor chip, is electrically coupled and fixed to the substrate 110C by bump electrodes PEC2, and is sealed by a resin material, such as resin REC2, together with the bump electrodes PEC2. The search key generating unit 14 may be included in the concatenated search data generating unit 130B or the associative memory 120A.

Because a combination of a function of the concatenated search data generating unit 130B portion and a function of the associative memory 120A can be selected in accordance with each purpose or usage, the degree of freedom can be increased.

Figure 27:
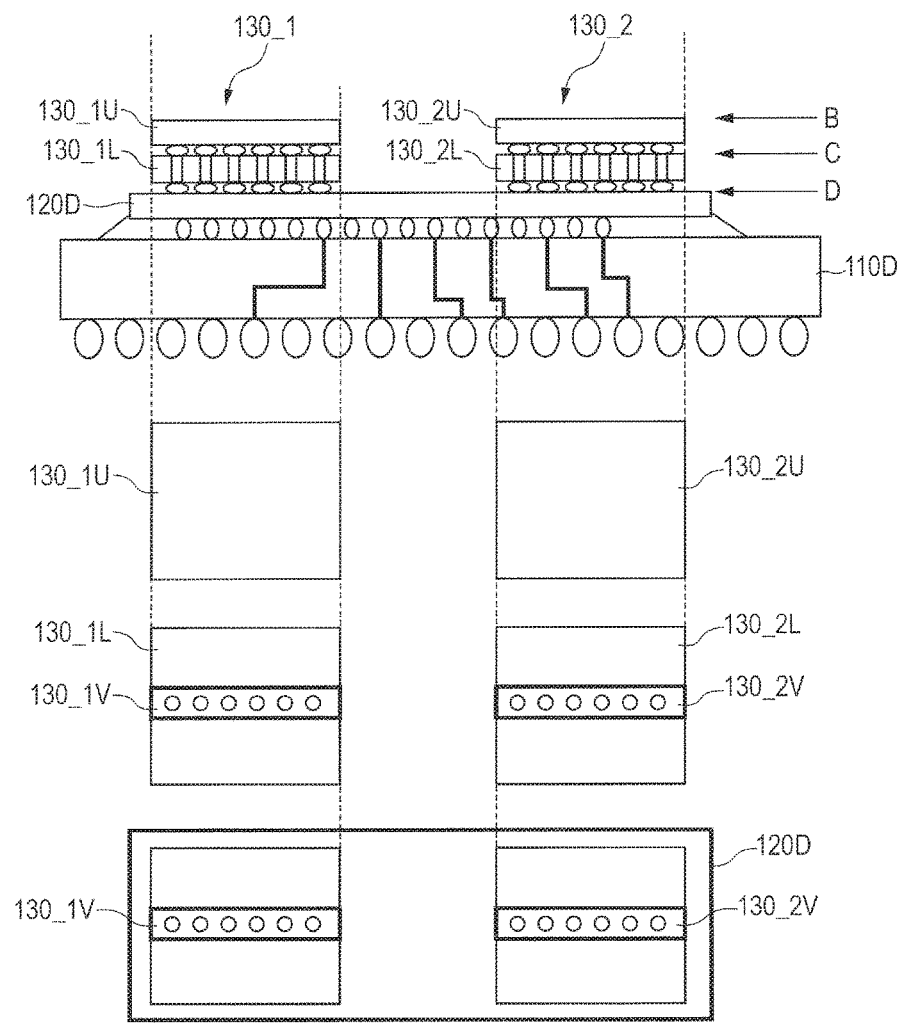
FIG. 27 illustrates a cross-sectional view and a developed plan view of a semiconductor device according to a fourth mounting example.

FIG. 27 illustrates a cross-sectional view and a developed plan view of a semiconductor device according to a fourth mounting example. The uppermost portion of FIG. 27 illustrates a cross-sectional view, the second portion illustrates a plan view in an upper surface (arrow B) of a concatenated search data generating unit, the third portion illustrates a plan view in an upper surface (arrow C) of a semiconductor chip as an underlying layer of the concatenated search data generating unit, and the lowermost portion illustrates a plan view in an upper surface (arrow D) of an associative memory. In a semiconductor device 100D, two concatenated search data generating units 130_1 and 130_2 are mounted on an associative memory 120D. The associative memory 120D includes a semiconductor chip including the first associative memory 11 and the second associative memory 12, and is fixed to a substrate 110D by bump electrodes. A circuit-forming surface of the semiconductor chip is sealed together with the bump electrodes by resin or the like. In the concatenated search data generating unit 130_1, two semiconductor chips 130_1U and 130_1L including the concatenated search data generating unit 13 are coupled to the associative memory 120D by silicon through via electrodes 130_1V. In the concatenated search data generating unit 130_2, two semiconductor chips 130_2U and 130_2L are coupled to the associative memory 120D via silicon through via electrodes 130_2V. The search key generating unit 14 may be included in the concatenated search data generating unit 130_1 or 130_2, or the associative memory 120D.

In the second mounting example of FIG. 25, when the memory capacity of the associative memory becomes large, the chip size becomes larger. Therefore, it is likely that the concatenated search data generating unit that can deal with all the associative memories cannot be mounted. This can improved by arranging a plurality of concatenated search data generating units on a memory array of the associative memory, while increase of the package size of the associative memory is suppressed. For example, the optimum arrangement corresponding to an array configuration of a TCAM, and therefore a low latency and low consumption can be achieved.

The substrate in the first to fourth mounting examples may be a substrate used in a package or a substrate of a system board.

Modified Example

A modified example of the example is described.

It is possible to more efficiently use an associative memory portion by effectively using a method for storing data into the concatenated search data generating unit. For example, in a case of using a TCAM as an associative memory, it is necessary to expand an IP address, a port number, and the like into many entries by one rule in a network instrument. However, overlapping portions in the rule can be shared as flag information, and therefore we propose to reduce the memory usage. In the method of the comparative example, the memory usage increases by products of combinations. On the other hand, in this flag method, because it is enough that the memory usage is substantially a sum of flags, the memory usage can be largely reduced.

First, a range expression in an ACL table in the modified example is described, referring to FIG. 28. FIG. 28 illustrates a relation between a range expression and a don't care expression in the ACL table.

When [2-9] is described as a rule, this range can be expressed by using three range expressions, i.e., range expressions Nos. 1 to 3 ([2-3], [4-7], and [8-9]). When [10-15] is described as a rule, this range can be expressed by using two range expressions, i.e., range expressions Nos. 4 and 5 ([10-11] and [12-15]).

Next, an example in which an ACL table is stored in an associative memory of the comparative example is described, referring to FIGS. 29A and 29B. FIG. 29A illustrates an example of the ACL table. FIG. 29B illustrates an example of storing the ACL table of FIG. 29A in the associative memory of the comparative example.

As illustrated in FIG. 29A, three rules are described as the ACL table. As illustrated in FIG. 29B, Rule #1 requires three expressions of [2-3], [4-7], and [8-9] in a [2-9] portion of a source port number (Src. Port), and requires two expressions of [10-11] and [12-15] in a [10-15] portion of a destination port number (Dst. Port). Therefore, when these combinations are expressed as a rule, 3×2, that is, 6 entries are used for expression.

Similarly, as illustrated in FIG. 29B, Rule #2 requires two expressions of [4-7] and [8-9] in a [4-9] portion of the source port number (Src. Port) and requires two expressions of [12-15] and [16-17] in a [12-17] portion of the destination port number (Dst. Port). Therefore, when these combinations are expressed as a rule, 2×2, that is, 4 entries are required.

On the other hand, as illustrated in FIG. 29B, Rule #3 can describe each of the source port number (Src. Port) and the destination port number (Dst. Port) by one type of expression. Therefore, the combination can be expressed by 1×1, that is, 1.

Therefore, a memory corresponding to 11 entries in total is consumed in order to store these three rules in the associative memory of the comparative example. For example, when the source port number (Src. Port) is 16 bits, the destination port number (Dst. Port) is 16 bits, a protocol (Protocol) is 8 bits, a source IP address (Src. Add) is 32 bits, and a destination IP address (Dst. Add) is 32 bits, 104 bits are required for one entry, and therefore a memory corresponding to 11 entries×104 bits=1,144 bits is consumed.

This example is used in order to describe that the expressing method of the comparative example is not effective in a case where a rule expression is not expanded, such as a combination of Rule #3, but may be used, whereas this example can be achieved by the expressing method of this embodiment.

Figure 30:
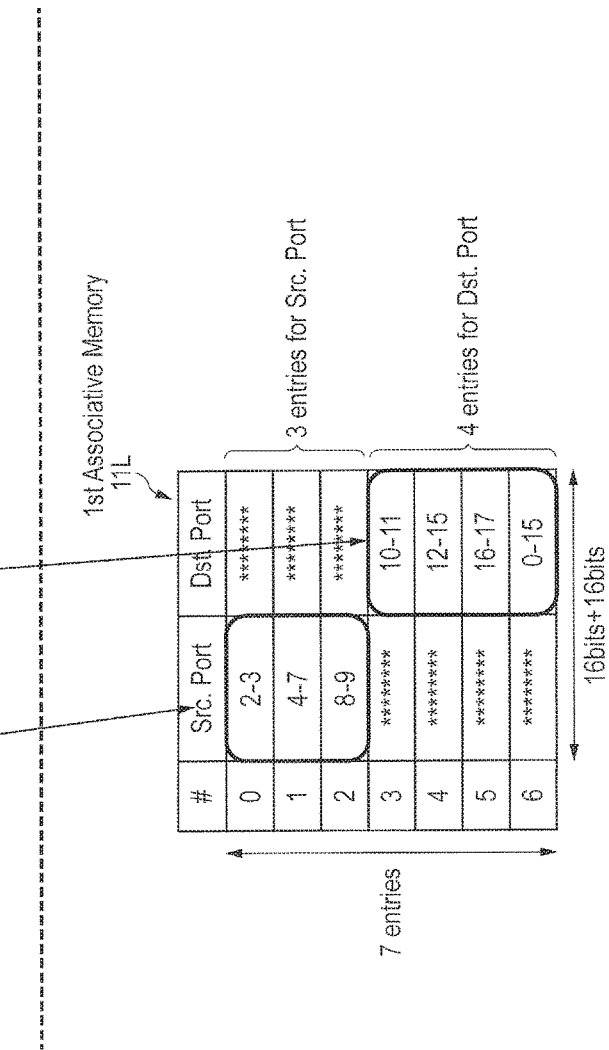
FIG. 30 is an explanatory diagram of a method for storing data into a first associative memory according to a modified example.
Figure 31:
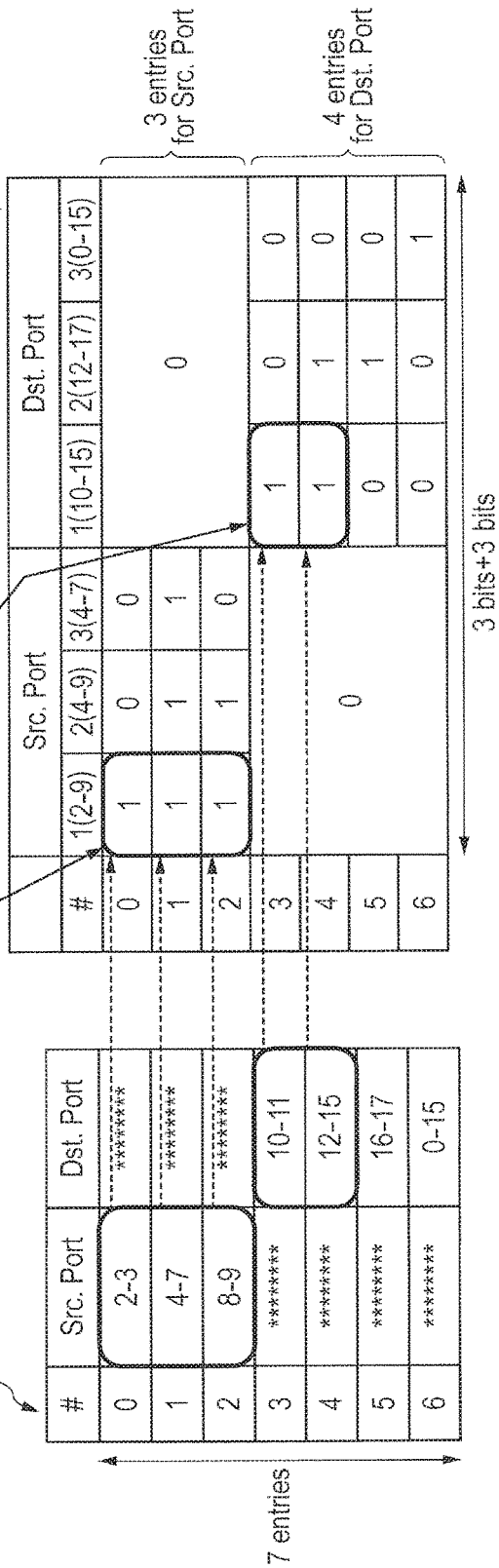
FIG. 31 is an explanatory diagram of a prior program with regard to a concatenated search data generating unit according to the modified example.
Figure 32:
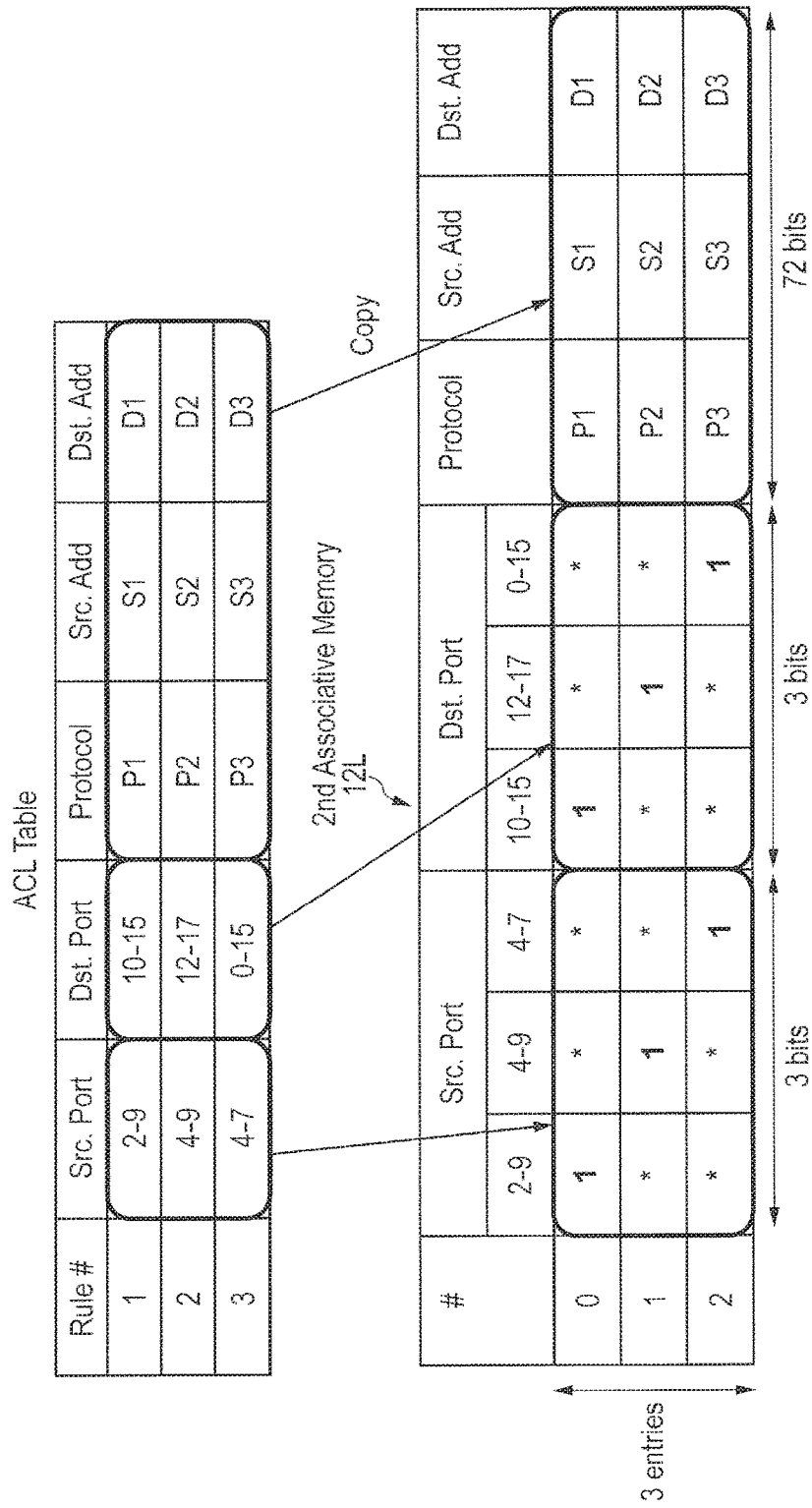
FIG. 32 is an explanatory diagram of a method for storing data into a second associative memory according to the modified example.

Next, a method for storing data in an associative memory according to the modified example is described, referring to FIGS. 30 to 32. FIG. 30 is an explanatory diagram of the method for storing data into a first associative memory unit according to the modified example. An upper portion in FIG. 30 illustrates the same ACL table as that of FIG. 29A. A lower portion in FIG. 30 illustrates a first associative memory. In the modified example, a case of using a TCAM as an associative memory is described.

In the modified example, memory consumption is suppressed by using the same range expression for different rules in common.

In order to achieve this, first, a method for storing a source port number (Src. Port) portion in the associative memory is described. Rule #1 describes [2-9] of the source port number (Src. Port). Therefore, [2-9] can be expressed by using three expressions [2-3], [4-7], and [8-9], as illustrated in FIG. 28. Rule #2 uses a range expression [4-9], which can be expressed by using two expressions [4-7] and [8-9]. Rule #3 uses a range expression [4-7], which can be expressed by one expression of [4-7]. When these are put together, it is found that the source port number (Src. Port) portions in three rules can be expressed by using three kinds of expressions [2-3], [4-7], and [8-9]. Therefore, as illustrated in FIG. 30, data is stored in form of a left column in a first associative memory 11L.

Next, a destination port number (Dst. Port) portion is described. Similarly, that portion in Rule #1 uses a range expression [10-15], which can be two kinds of expressions of [10-11] and [12-15], as illustrated in FIG. 28. Rule #2 uses a range expression [12-17], which can be expressed by two expressions [12-15] and [16-17]. Rule #3 uses a range expression [0-15], which can be expressed by one expression [0-15]. When overlapping portions are removed in a similar manner to that for the source port number (Src. Port), the destination port number portions can be expressed by four kinds of expressions [10-11], [12-15], [16-17], and [0-15]. Therefore, data is stored in form of a right column in the first associative memory 11A, as illustrated in FIG. 30. In this case, "*" is put into a portion on the right side of the portion of the source port number (Src. Port) in which data is stored by using a range expression (a portion corresponding to the destination port number (Dst. Port) portion). By setting this portion to be "*" (don't care), concatenation of search data to a concatenated search data generating unit 13L and a second associative memory 12L that will be described later can be achieved.

By using the don't care expression, it is possible to suppress memory consumption by an amount corresponding to overlapping portions of in a rule, because the rule can be stored in a table in a flag method in the concatenated search data generating unit 13L and the second associative memory 12L. Similarly, in a portion in which data is stored in the destination port number (Dst. Port), "*" (don't care) is put into a portion corresponding to the source port number (Src. Port).

Thus, in the first associative memory 11L, it is possible to achieve expressions by 7 entries×16 bits (when it is assumed that each of the source port number (Src. Port) and the destination port number (Dst. Port) is 16 bits that are general in IPv4 and IPv6) in total.

Data is stored by using a plurality of entries for storing a rule described by a range expression, and a range expression that can be also used for a different rule is made common.

Next, a flag managing method and handed-over data in the concatenated search data generating unit are described. FIG. 31 is an explanatory diagram of an advance program for the concatenated search data generating unit according to the modified example. An upper portion in FIG. 31 illustrates the same ACL table as that of FIG. 29A. A lower left portion in FIG. 31 illustrates the first associative memory 11L. A lower right portion in FIG. 31 illustrates the concatenated search data generating unit 13L.

Rule information ("1" at a portion corresponding to each rule) is programmed in advance in the concatenated search data generating unit 13L prior to a search, in order to allowing a search result to be handed over. The concatenated search data generating unit 13L assigns memory to each entry of the first associative memory 11L.

First, a method that stores data with respect to a rule number of 0 (Rule #0) is described. At a left end of a source port number (Src. Port) block in the concatenated search data generating unit 13A, data for Rule "0 is stored. There is no rule information in the first associative memory 11L, because each range expression is stored not to overlap other range expression. Therefore, it is necessary to express the rule information. As described before, the first associative memory 11L and the concatenated search data generating unit 13L are associated with each other on an entry-by-entry basis, and a range expression required for each rule is used in a flag format. Rule #0 uses three expressions [2-3], [4-7], and [8-9] in expressions of the source port numbers (Src. Port), and therefore "1" is programmed in #0, #1, and #2 in the concatenated search data generating unit 13A. #3 to #6 correspond to the destination port numbers (Dst. Port), and therefore "0" is programmed therein. Similarly, "1" is set in a portion of a used range expression also in portions corresponding to Rules #2 and #3.

Regarding the destination port number (Dst. Port), it is expressed by using #3 to #6 in the first associative memory 11L in the illustrated example. Therefore, a range expression is selected in a flag format in #3 to #6 of the concatenated search data generating unit 13A in the same manner as that performed for the source port numbers (Src. Port), and "1" is set in a portion of a used range expression for each rule in the same procedure as that performed for the source port numbers (Src. Port). In a data region of the destination port number (Dst. Port), a flag related to a corresponding source port number (Src. Port) is not set in #0 to #2. #0 to #2 are made to remain "0". 3 bits are used for a source port number (Src. Port) and three bits are used for a destination port number (Dst. Port).

Next, a method for storing data into the second associative memory 12L is described. FIG. 32 is an explanatory diagram of the method for storing data into the second associative memory according to the modified example. An upper portion in FIG. 32 is the same ACL table as that of FIG. 29A. A lower portion in FIG. 32 is the second associative memory. In the illustrated example, a portion of the associative memory (6 bits in the illustrated example) is used as a flag for concatenating search results.

"1" is set in an entry corresponding to each rule of a portion described with a source port number (Src. Port) of the second associative memory 12L. "*" is set in a portion different from its own rule. In the illustrated example, "1" is put into Entry #0 and "*" is put into Entries #1 and #2 in a column of [2-9] of the source port numbers (Src. Port). In a column of [4-9], "1" is put into Entry #1 and "*" is put into Entries #0 and #2. In a column of [4-7], "*" is put into Entries #0 and #1 and "1" is put into Entry #2. Also in a portion of a destination port number (Dst. Port), in a column of [10-15], "1" is put into Entry #0 and "*" is put into other entries in a similar manner. In a column of [12-17], "1" is put into Entry #1 and "*" is put into Entries #0 and #2. In a column of [0-15], "1" is put into Entry #2 and "*" is put into Entries #0 and #1. 3 bits are used for a source port number (Src. Port) and three bits are used for a destination port number (Dst. Port). To remaining portions, i.e., a protocol, a source IP address (Src. Add), a destination IP address (Dst. Add), data of a rule may be copied without any change, This use of "*" enables a correct result to be obtained in the second associative memory 12L even when a search result in which a hit occurs for a plurality of rules in the first associative memory 11L is handed over.

Figure 33B:
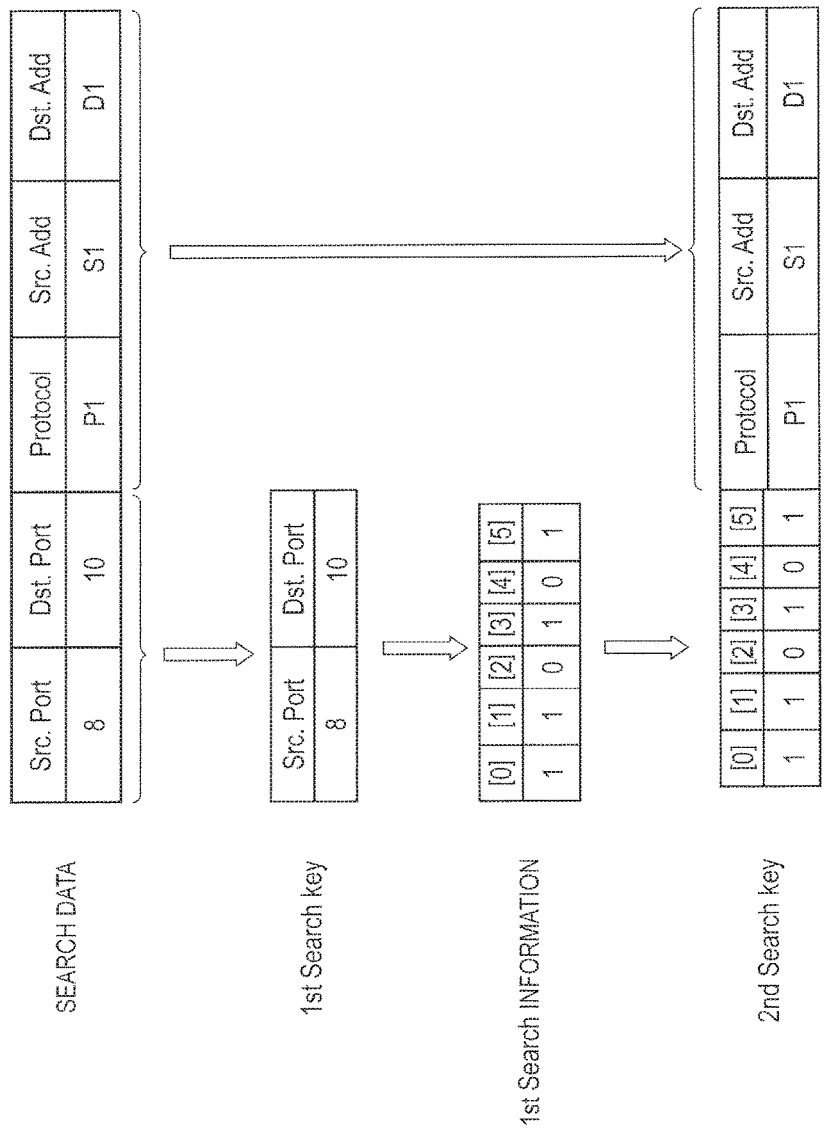
FIG. 33B illustrates search data, a first search key, first search information, and second search information in FIG. 33A.
Figure 33D:
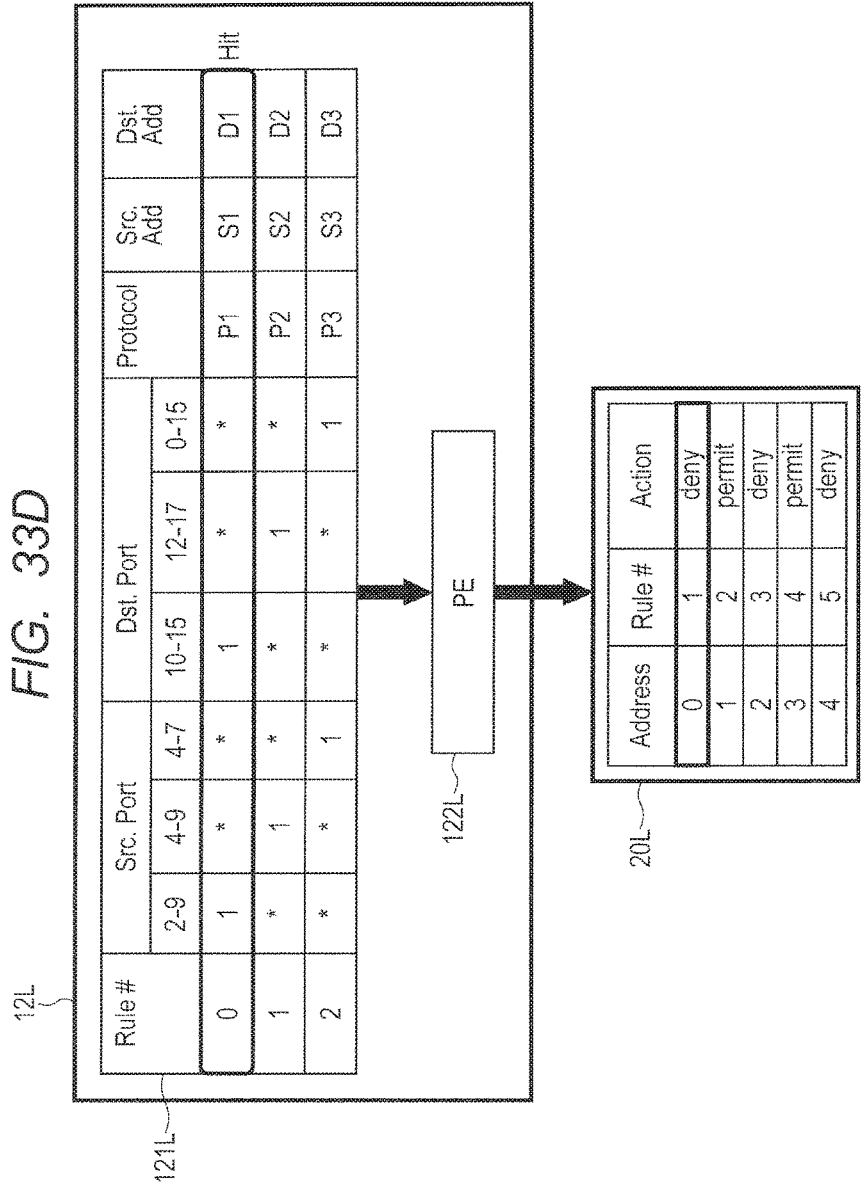
FIG. 33D illustrates a second associative memory and an action memory portion in FIG. 33A.

Next, a search mechanism according to the modified example is described, referring to FIGS. 33A to 33D. FIG. 33A is an explanatory diagram of an outline of the search mechanism according to the modified example. FIG. 33B illustrates search data, a first search key, first search information, and a second search key in FIG. 33A. FIG. 33C illustrates a first associative memory and a concatenated search data generating unit in FIG. 33A. FIG. 33D illustrates a second associative memory and an action memory in FIG. 33A.

A network device according to the modified example includes a search device 1L and a network control device (NCU) 2L. The search device 1L includes an associative memory unit 10L and an action memory unit 20L. The associative memory unit 10L includes the first associative memory 11L, the second associative memory 12L, and the concatenated search data generating unit 13L, and the search key generating unit 14L. The network control device 2L is configured by a NPU (network processor), an ASIC, or the like. In the modified example, a case of using a TCAM as an associative memory is described. A case is described in which the number of entries in the first associative memory is 7, the number of entries in the second associative memory is smaller than the number of entries in the first associative memory and is 3, and the number of rules is 3.

A main operation flow of the search device 1L is described here.

(1) The network control device 2L sends data that becomes a search object (search data), as illustrated in FIG. 33B, to the search key generating unit 14L in the associative memory unit 10L of the search device 1L. First, the search key generating unit 14L generates the first search key (1st Search Key) as illustrated in FIG. 33B from the sent search data.

(2) In a search at the first step, the first associative memory 11L searches data in the first associative memory 11L by using the first search key (1st Search Key) generated by the search key generating unit 14L When a plurality of pieces of data match the first search key (1st Search Key) that is search key data, all pieces of multiple-hit information (a state in which a plurality of pieces of data match a key) are transmitted to the concatenated search data generating unit 13L. As illustrated in FIG. 33C, data in Entries #2, #3, and #6 in the first associative memory 11L matches the first search key, so that multiple hits occur.

(3) Subsequently, the result of the search in the first associative memory 11L is classified and is subjected to logical compression in the concatenated search data generating unit 13L, and is then output to the search key generating unit 14L as first search (1st search) information in order to generate the second search key (2nd Search Key). As illustrated in FIG. 33C, multi-hit information for the entries (Indexes) at which a hit (Hit) occurs is sent to the concatenated search data generating unit 13L, thereby search information is handed over. In the concatenated search data generating unit 13L, data (a rule number (Rule #)) corresponding to an entry is stored, and the concatenated search data generating unit performs compression to obtain data the number of pieces of which is the number of rules. More specifically, a result of AND of a portion programmed to be "1" in advance and the number of entries at which hit (Hit) occurs in the first associative memory 11L is merged to data sent to the concatenated search data generating unit 13L, so that search result information (a search result flag) that is handed over to the second associative memory 12L. In this illustrated example, a search result flag of 6'b110101 is generated as concatenated search data in the concatenated search data generating unit 13L and is sent to the search key generating unit 14L.

(4) Subsequently, the search key generating unit 14L uses information on the search result in the first associative memory 11L (1st search information) supplied from the concatenated search data generating unit 13L and the search data input thereto at first, and generates the second search key (2nd Search Key) to be used in a search in the second step, as illustrated in FIG. 33B. More specifically, the second search key (2nd Search Key) is generated by synthesizing a remaining key of the original search data sent from the network control device 2, that is not used in the first search key (1st Search Key), and the search result flag to each other. Due to this manner of generation, it is possible to establish a search operation by using a flag portion for concatenating the search result, that is programmed in advance in a portion of the second associative memory 12L. The search key generating unit 14L synthesizes the search result flag to {Protocol, Src. Add, Dst. Add}={P1, S2, D1}, so that the second search key (2nd Search Key) is generated in form of {6'b110101, P1, S2, D1}.

(5) The second associative memory 12L searches as to whether the second search key (2nd Search Key) is included in data within the second associative memory 12L by using the second search key (2nd Search Key) generated by the search key generating unit 14L. As illustrated in FIG. 33D, hit occurs in Entry #0 in the second associative memory 12L.

(6) In this illustrated example, a configuration is employed in which a priority encoder (PE) 122L is coupled to a memory unit 121L of the second associative memory 12L. Therefore, when a plurality of pieces of data match, the search result is sent to the action memory unit 20L with only one of matched addresses, which has the highest priority, regarded as a final search result (a hit index).

(7) In the action memory unit 20L, it is programmed in advance which action is to be performed for data input to the search device 1 (e.g., an IP address, or a port number) based on the search result. The action memory unit 20L transmits a result of a data reading operation of the action memory unit 20L, which corresponds to the address of the final search result, to the network control device 2. With this transmission, a series of search operations is completed. In FIG. 33D, deny in Entry #0 is output as an action (Action).

Next, a comparison result of memory consumption between the comparative example and the modified example is described. In the comparative example, as illustrated in FIG. 29B, it is necessary to use 11 entries×104 bits 1,144 bits for the ACL table illustrated in FIG. 29A. On the other hand, in the modified example, the ACL table illustrated in FIG. 29A can be achieved by using 7 entries×16 bits×2=224 bits for the first associative memory 11L, 7 entries×6 bits=42 bits for the concatenated search data generating unit 13L, and 3 entries×(6 bits+72 bits) 234 bits for the second associative memory 12A, that is, 504 bits in total, as illustrated in FIGS. 30, 31, and 32. Therefore, the memory usage in the modified example corresponds to 504 bits/1,144 bits=44.1%, that is, the modified example can save the memory usage by about 56%.

In the above description, the invention made by the inventors of the present application has been specifically described by way of the embodiment. However, the present invention is not limited to the aforementioned embodiment, and can be changed in various ways within the scope not departing from the gist thereof.

In the example and the modified example, an example is described in which a priority encoder is used for obtaining one final search result, so that address information for reading out data in an action memory unit is generated. However, in a case where a mode that allows search results at the second step to be output as multiple matches is suitable as an application (for a security purpose, for example), the priority encoder is not necessary provided.

In the example and the modified example, an example of using a TCAM as an associative memory is described. Instead, a BCAM may be used. In a case of using the BCAM, a long key search can be performed, although there is a limitation that the search cannot deal with a 3 (Ternary) value. Also in this case, an effect of saving memory usage and an effect of reducing power consumption are effective as in the example.

In the example and the modified example, an example of providing only one search device is described for simplifying the description. However, by making a plurality of search devices operate simultaneously, it is possible to easily achieve parallel processing, resulting in large improvement of a processing performance. Further, although an action memory unit is described as being provided in the search device, it may be configured as a memory outside the search device by arranging a commercially available DDR memory on a board.

What is claimed is:

1. A search device comprising:
   a first associative memory that is searched with a first search key;
   a second associative memory that is searched with a second search key;
   a first concatenated search data generating unit that generates first search information based on hit information including multiple hits in the first associative memory; and
   a search key generating unit that includes a first search key generating unit generating the first search key based on search data and a second search key generating unit generating the second search key based on the first search information and the search data.

2. The search device according to claim 1,
   wherein the first search key is configured by a portion of the search data, and the second search key is configured by the first search information and a reminder obtained by removing the portion from the search data.

3. The search device according to claim 1,
   wherein the first associative memory has M entries,
   wherein the second associative memory has L entries,
   wherein the first concatenated search data generating unit compresses a plurality of pieces of hit information in the first associative memory into data of a preset number of rules to generate the first search information, and
   wherein the number of rules is N.

4. The search device according to claim 3,
   wherein the first concatenated search data generating unit includes
   a memory that stores rule information corresponding the entries of the first associative memory, and
   a compressing circuit that generates the first search information having an N-bit length from rule information of a hit entry in the first associative memory read from the memory.

5. The search device according to claim 4,
   wherein the memory stores rule information having the N-bit length therein for each entry, and
   wherein the compressing circuit includes a circuit that obtains OR or NOR, or Wired OR or Wired NOR of output data of the memory on a bit-by-bit basis.

6. The search device according to claim 4,
   wherein the memory stores rule information having the N-bit length therein for each entry, and
   wherein the compressing circuit includes a CPU and generates the first search information based on output data of the memory.

7. The search device according to claim 1,
   wherein the second associative memory includes a priority encoder and outputs one piece of hit information in accordance with a predetermined priority when there are multiple hits.

8. The search device according to claim 7, further comprising
   an action memory that outputs next-operation information by an access by an output of the second associative memory.

9. The search device according to claim 1,
   wherein the first associative memory and the second associative memory are each configured by a TCAM.

10. The search device according to claim 1, further comprising:
    a third associative memory that is searched with a third search key; and
    a second concatenated search data generating unit that generates second search information based on hit information including multiple hits in the third associative memory,
    wherein the search key generating unit further includes a third search key generating unit generating the third search key based on the second search information and the search data.

11. The search device according to claim 1, further comprising:
    a fourth associative memory that is searched with the second search key;
    a search enable signal generating unit; and
    a table data managing unit that transmits concatenating information of a table to which a hit index belongs to the search enable signal generating unit,
    wherein the search enable signal generating unit generates a signal that activates at least one of the second associative memory and the third associative memory based on the concatenating information.

12. The search device according to claim 11, further comprising
    a priority encoder that determines priorities of an output of the second associative memory and an output of the fourth associative memory.

13. The search device according to claim 1, further comprising
    a fifth associative memory that is searched with the first search key,
    wherein the first concatenated search data generating unit generates first search information based on hit information including the multiple hits in the first associative memory and hit information including multiple hits in the fifth associative memory.

14. The search device according to claim 3,
wherein L has a value smaller than M, and
wherein N has a value smaller than M.

15. A semiconductor device comprising:
an associative memory unit that is configured by a TCAM and includes a first associative memory searched with a first search key and a second associative memory searched with a second search key;
a concatenated search data generating unit that generates first search information based on hit information including multiple hits in the first associative memory; and
a search key generating unit that includes a first search key generating unit generating the first search key based on search data and a second search key generating unit generating the second search key based on the first search information and the search data,
wherein the associative memory unit is formed by a single semiconductor chip, and
wherein the concatenated search data generating unit is formed by a different semiconductor chip from the associative memory unit.

16. The semiconductor device according to claim 15, wherein the search key generating unit is formed in the semiconductor chip of the associative memory unit or the semiconductor chip of the concatenated search data generating unit.

17. The semiconductor device according to claim 16, further comprising
a substrate on which the associative memory unit is mounted, and bump electrodes arranged over a surface opposite to a surface on which the associative memory unit is mounted.

18. The semiconductor device according to claim 17, wherein the concatenated search data generating unit is mounted over the substrate.

19. The semiconductor device according to claim 18, wherein the concatenated search data generating unit is formed by stacking a plurality of semiconductor chips with a TSV.

20. The semiconductor device according to claim 17, wherein the concatenated search data generating unit is formed by stacking a plurality of chips with a TSV, and
wherein the semiconductor chip of the concatenated search data generating unit and the semiconductor chip of the associative memory unit are stacked with a TSV.

* * * * *